(12) United States Patent
Zheng et al.

(10) Patent No.: US 8,330,136 B2
(45) Date of Patent: Dec. 11, 2012

(54) HIGH CONCENTRATION NITROGEN-CONTAINING GERMANIUM TELLURIDE BASED MEMORY DEVICES AND PROCESSES OF MAKING

(75) Inventors: Jun-Fei Zheng, Westport, CT (US); Jeffrey F. Roeder, Brookfield, CT (US); Weimin Li, New Milford, CT (US); Philip S. H. Chen, Bethel, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 13/132,369

(22) PCT Filed: Dec. 4, 2009

(86) PCT No.: PCT/US2009/066805
§ 371 (c)(1),
(2), (4) Date: Jul. 5, 2011

(87) PCT Pub. No.: WO2010/065874
PCT Pub. Date: Jun. 10, 2010

(65) Prior Publication Data
US 2011/0260132 A1    Oct. 27, 2011

Related U.S. Application Data

(60) Provisional application No. 61/120,238, filed on Dec. 5, 2008, provisional application No. 61/158,848, filed on Mar. 10, 2009, provisional application No. 61/166,918, filed on Apr. 6, 2009.

(51) Int. Cl.
*H01L 29/02* (2006.01)
*H01L 47/00* (2006.01)
*H01L 21/00* (2006.01)

(52) U.S. Cl. .................... 257/2; 257/E31.029

(58) Field of Classification Search ........ 257/2, E31.029; 438/3
See application file for complete search history.

(56) References Cited

U.S. PATENT DOCUMENTS
3,467,686 A    9/1969    Creamer
(Continued)

FOREIGN PATENT DOCUMENTS
EP    1 466 918 A1    10/2004
(Continued)

OTHER PUBLICATIONS

Abrutis, A., et al., "Hot-Wire Chemical Vapor Deposition of Chalcogenide Materials for Phase Change Memory Applications", "Chem. Mater.", 2008, pp. 3557-3559, vol. 20.
(Continued)

*Primary Examiner* — William D Coleman
(74) *Attorney, Agent, or Firm* — Mary B. Grant; Hultquist PLLC; Maggie Chappuis

(57) ABSTRACT

A PCM device has the composition $Ge_xTe_yN_zA_m$ deposited onto a substrate, where x is about 40% to about 60%, y is about 30% to about 49%, and z is about 5% to about 20% and more preferably about 5% to about 40%. The component represented as A is optional and representative of an element of Sb, Sn, In, Ga, or Zn, and m is up to about 15%. The composition is in the form of a film, and the nitrogen allows for the substantially conformal deposition of the film onto the substrate. A CVD process for depositing the PCM comprises delivering a Ge-based precursor and a Te-based precursor in vapor form to a CVD chamber, heating and pressurizing the chamber, and depositing the film onto a substrate. In making a phase change device using this process, the film is annealed and polished.

20 Claims, 10 Drawing Sheets

U.S. PATENT DOCUMENTS

| | | | |
|---|---|---|---|
| 4,383,119 A | 5/1983 | Pullukat et al. |
| 4,491,669 A | 1/1985 | Arkles et al. |
| 4,499,198 A | 2/1985 | Pullukat et al. |
| 4,895,709 A | 1/1990 | Laine |
| 4,927,670 A | 5/1990 | Erbil |
| 4,948,623 A | 8/1990 | Beach et al. |
| 4,960,916 A | 10/1990 | Pazik |
| 4,962,214 A | 10/1990 | Villacorta et al. |
| 5,003,092 A | 3/1991 | Beachley, Jr. |
| 5,008,422 A | 4/1991 | Blum et al. |
| 5,084,588 A | 1/1992 | Ocheltree et al. |
| 5,139,825 A | 8/1992 | Gordon et al. |
| 5,178,911 A | 1/1993 | Gordon et al. |
| 5,210,254 A | 5/1993 | Ritscher et al. |
| 5,225,561 A | 7/1993 | Kirlin et al. |
| 5,268,496 A | 12/1993 | Geisberger |
| 5,312,983 A | 5/1994 | Brown et al. |
| 5,417,823 A | 5/1995 | Narula et al. |
| 5,442,200 A | 8/1995 | Tischler |
| 5,453,494 A | 9/1995 | Kirlin et al. |
| 5,566,045 A | 10/1996 | Summerfelt et al. |
| 5,576,928 A | 11/1996 | Summerfelt et al. |
| 5,583,205 A | 12/1996 | Rees, Jr. |
| 5,596,522 A | 1/1997 | Ovshinsky et al. |
| 5,698,726 A | 12/1997 | Rauleder et al. |
| 5,719,417 A | 2/1998 | Roeder et al. |
| 5,726,294 A | 3/1998 | Rees, Jr. |
| 5,820,664 A | 10/1998 | Gardiner et al. |
| 5,919,522 A | 7/1999 | Baum et al. |
| 5,976,991 A | 11/1999 | Laxman et al. |
| 5,980,265 A | 11/1999 | Tischler |
| 5,998,236 A | 12/1999 | Roeder et al. |
| 6,005,127 A | 12/1999 | Todd et al. |
| 6,015,917 A | 1/2000 | Bhandari et al. |
| 6,086,779 A | 7/2000 | Bishop et al. |
| 6,133,051 A | 10/2000 | Hintermaier et al. |
| 6,146,608 A | 11/2000 | Todd et al. |
| 6,269,979 B1 | 8/2001 | Dumont |
| 6,319,565 B1 | 11/2001 | Todd et al. |
| 6,399,208 B1 | 6/2002 | Baum et al. |
| 6,506,666 B2 | 1/2003 | Marsh |
| 6,511,718 B1 | 1/2003 | Paz de Araujo et al. |
| 6,646,122 B1 | 11/2003 | Nuhlen et al. |
| 6,716,271 B1 | 4/2004 | Arno et al. |
| 6,750,079 B2 | 6/2004 | Lowrey et al. |
| 6,767,830 B2 | 7/2004 | Wang et al. |
| 6,787,186 B1 | 9/2004 | Hintermaier |
| 6,861,559 B2 | 3/2005 | Odom |
| 6,869,638 B2 | 3/2005 | Baum et al. |
| 6,872,963 B2 | 3/2005 | Kostylev et al. |
| 6,916,944 B2 | 7/2005 | Furukawa et al. |
| 6,984,591 B1 | 1/2006 | Buchanan et al. |
| 6,998,289 B2 | 2/2006 | Hudgens et al. |
| 7,005,303 B2 | 2/2006 | Hintermaier et al. |
| 7,029,978 B2 | 4/2006 | Dodge |
| 7,087,482 B2 | 8/2006 | Yeo et al. |
| 7,115,927 B2 | 10/2006 | Hideki et al. |
| 7,312,165 B2 | 12/2007 | Jursich et al. |
| 7,371,429 B2 | 5/2008 | Lee et al. |
| 7,399,666 B2 | 7/2008 | Ahn et al. |
| 7,402,851 B2 | 7/2008 | Hideki et al. |
| 7,419,698 B2 | 9/2008 | Jones |
| 7,425,735 B2 | 9/2008 | Park et al. |
| 7,462,900 B2 | 12/2008 | Hideki et al. |
| 7,476,917 B2 | 1/2009 | Hideki et al. |
| 7,569,417 B2 | 8/2009 | Lee et al. |
| 7,615,401 B2 | 11/2009 | Park et al. |
| 7,704,787 B2 | 4/2010 | Hideki et al. |
| 7,728,172 B2 | 6/2010 | Lee et al. |
| 7,838,329 B2 | 11/2010 | Hunks et al. |
| 7,943,502 B2 | 5/2011 | Park et al. |
| 2002/0004266 A1 | 1/2002 | Hashimoto et al. |
| 2002/0090815 A1 | 7/2002 | Koike et al. |
| 2003/0135061 A1 | 7/2003 | Norman et al. |
| 2004/0012009 A1* | 1/2004 | Casagrande et al. ............ 257/4 |
| 2004/0038808 A1 | 2/2004 | Hampden-Smith et al. |
| 2004/0197945 A1 | 10/2004 | Woelk et al. |
| 2004/0215030 A1 | 10/2004 | Norman |
| 2005/0082624 A1 | 4/2005 | Gousev et al. |
| 2005/0208699 A1 | 9/2005 | Furkay et al. |
| 2005/0283012 A1 | 12/2005 | Xu et al. |
| 2005/0287747 A1 | 12/2005 | Chakravarti et al. |
| 2006/0006449 A1 | 1/2006 | Jeong et al. |
| 2006/0027451 A1 | 2/2006 | Park et al. |
| 2006/0035462 A1 | 2/2006 | Millward |
| 2006/0046521 A1 | 3/2006 | Vaartstra et al. |
| 2006/0049447 A1 | 3/2006 | Lee et al. |
| 2006/0115595 A1 | 6/2006 | Shenai-Khatkhate et al. |
| 2006/0138393 A1 | 6/2006 | Seo et al. |
| 2006/0141155 A1 | 6/2006 | Gordon et al. |
| 2006/0172067 A1 | 8/2006 | Ovshinsky et al. |
| 2006/0172083 A1 | 8/2006 | Lee et al. |
| 2006/0180811 A1 | 8/2006 | Lee et al. |
| 2007/0121363 A1 | 5/2007 | Lung |
| 2007/0154637 A1 | 7/2007 | Shenai-Khatkhate et al. |
| 2007/0160760 A1 | 7/2007 | Shin et al. |
| 2008/0003359 A1 | 1/2008 | Gordon et al. |
| 2008/0035906 A1 | 2/2008 | Park et al. |
| 2008/0035961 A1 | 2/2008 | Chen et al. |
| 2008/0078984 A1 | 4/2008 | Park et al. |
| 2008/0210163 A1 | 9/2008 | Carlson et al. |
| 2008/0254218 A1 | 10/2008 | Lei et al. |
| 2008/0254232 A1 | 10/2008 | Gordon et al. |
| 2008/0290335 A1 | 11/2008 | Lin et al. |
| 2009/0087561 A1 | 4/2009 | Chen et al. |
| 2009/0097305 A1 | 4/2009 | Bae et al. |
| 2009/0112009 A1 | 4/2009 | Chen et al. |
| 2009/0124039 A1 | 5/2009 | Roeder et al. |
| 2009/0215225 A1 | 8/2009 | Stender et al. |
| 2009/0227066 A1 | 9/2009 | Joseph et al. |
| 2009/0275164 A1 | 11/2009 | Chen et al. |
| 2009/0291208 A1 | 11/2009 | Gordon et al. |
| 2009/0305458 A1 | 12/2009 | Hunks et al. |
| 2009/0321733 A1 | 12/2009 | Gatineau et al. |
| 2010/0018439 A1 | 1/2010 | Cameron et al. |
| 2010/0112211 A1 | 5/2010 | Xu et al. |
| 2010/0112795 A1 | 5/2010 | Kaim et al. |
| 2010/0164057 A1 | 7/2010 | Hunks et al. |
| 2010/0190341 A1 | 7/2010 | Park et al. |
| 2010/0209610 A1 | 8/2010 | Cameron et al. |
| 2010/0317150 A1 | 12/2010 | Hunks et al. |
| 2011/0001107 A1 | 1/2011 | Zheng |
| 2011/0060165 A1 | 3/2011 | Cameron et al. |
| 2011/0111556 A1 | 5/2011 | Chen et al. |
| 2011/0124182 A1 | 5/2011 | Zheng |

FOREIGN PATENT DOCUMENTS

| | | | |
|---|---|---|---|
| EP | 1675194 A2 | 6/2006 |
| EP | 1806427 A2 | 7/2007 |
| JP | 58038296 A | 3/1983 |
| JP | 5-311423 A | 11/1993 |
| JP | 06-080413 A | 3/1994 |
| JP | 06-293778 A | 10/1994 |
| JP | H07-263431 A | 10/1995 |
| JP | 08-074055 A | 3/1996 |
| JP | 2001-067720 A | 3/2001 |
| JP | 2002-220658 A | 8/2002 |
| KR | 1020050048891 A | 5/2005 |
| KR | 1020060091160 A | 8/2006 |
| KR | 1020070025612 A | 3/2007 |
| KR | 10-2008-0052362 A | 6/2008 |
| KR | 1020090008799 A | 1/2009 |
| SU | 768457 A | 10/1980 |
| WO | 0015865 A1 | 3/2000 |
| WO | 0067300 A1 | 11/2000 |
| WO | 2004046417 A2 | 6/2004 |
| WO | 2004076712 A1 | 9/2004 |
| WO | 2006012052 A2 | 2/2006 |
| WO | 2007140813 A1 | 12/2007 |
| WO | 2008002546 A1 | 1/2008 |
| WO | 2008057616 A1 | 5/2008 |
| WO | 2009006272 A1 | 1/2009 |
| WO | 2009020888 A1 | 2/2009 |
| WO | 2009034775 A1 | 3/2009 |
| WO | 2009059237 A2 | 5/2009 |
| WO | 2011002705 A2 | 1/2011 |

OTHER PUBLICATIONS

Allen, Frank. H. et al., "Tables of Bond Lengths Determined by X-ray and Neutron Diffraction", "J. Chem. Soc. Perkin Tran. II", Feb. 1987, pp. S1-S19.

Anderson, Herbert H., "Dialkylaminogermanes and Dialkylaminosilanes", "J. Amer. Chem. Soc.", Mar. 20, 1952, pp. 1421-1423, vol. 74, No. 6.

Anderson, Q. et al., "Synthesis and Characterization of the First Pentaphenylcyclopentadienyl Copper Complex (Ph5CP)Cu(PPh3)", "Organometallics", 1998, pp. 4917-4920, vol. 17.

Artaud-Gillet, M.C. et al., "Evaluation of copper organometallic sources for CuGaSe2 photovoltaic applications", "Journal of Crystal Growth", 2003, pp. 163-168, vol. 248.

Baines, K. et al., "A Facile Digermene-to-germylgermylene Rearrangement; Bulky Germylene Insertion into the Si—H Bond", "J. Chem. Soc. Chem. Commun.", 1992, pp. 1484-1485.

Baxter, D. et al., "Low Pressure Chemical Vapor Deposition of Metallic Films of Iron, Manganese, Cobalt, Copper, Germanium and Tin...", "Chemical Vapor Deposition", 1995, pp. 49-51, vol. 1, No. 2.

Behrens, S. et al., "Synthesis and Structure of the Nanoclusters", "Angew. Chem. Int. Ed. Engl.", 1996, pp. 2215-2218, vol. 35, No. 19.

Bochmann, M. et al., "Synthesis of Some Alkyl Metal Selenolato Complexes of Zinc, Cadmium and Mercury, X-Ray Crystal Structure of Me, Hg...", "Polyhedron", 1992, pp. 507-512, vol. 11, No. 5.

Bradley, Donald C., et al., "Metallo-organic compounds containing metal-nitrogen bonds: Part I, some dialkyamino derivatives of titanium and...", "J. Chem. Soc.", Oct. 1960, pp. 3857-3861.

Bradley, Donald C., et al., "Metallo-organic compounds containing metal-nitrogen bonds: Part III, Dialkylamino compounds of tantalum", "Canadian J. Chem.", Jul. 12, 1962, pp. 1355-1360, vol. 40, No. 7.

Bwembya, G. et al., "Phosphinochalcogenoic Amidato Complexes of Zinc and Cadmium as Novel Single-Source Precursors for the Deposition...", "Chemical Vapor Deposition", , pp. 78-80, vol. 1, No. 3.

Carmalt, CJ, et al., "Synthesis of titanium(IV) guanidinate complexes and the formation of titanium carbonitride via low-pressure chemical vap", "Inorganic Chemistry", Feb. 7, 2005, pp. 615-619, vol. 44, No. 3.

Chen, T. et al., "Low temperature Deposition of Ge Thin Films with a Ge(II) Silylamido Source", "ECS Transactions", 2007, pp. 269-278, vol. 11, No. 7, Publisher: The ElectroChemical Society.

Chiu, Hsin-Tien, et al., "Deposition of tantalum nitride thin films from ethylimidotantalum complex", "J. Mater. Sci. Lett.", Jan. 1992, pp. 96-98, vol. 11, No. 2.

Cho, K. et al., "Designing PbSe Nanowires and Nanorings through Oriented Attachment of Nanoparticles", "J. Am. Chem. Soc.", Apr. 23, 2005, pp. 7140-7147, vol. 127.

Choi, B. et al. "Combined Atomic Layer and Chemical Vapor Deposition, and Selective Growth of Ge2Sb2Te5 Films on TiN/W Contact Plug", "Chem. Mater.", Aug. 14, 2007, pp. 4387-4389, vol. 19.

Choi, B. et al., "Cyclic PECVD of Ge2Sb2Te5 Films Using Metallorganic Sources", "Journal of the Electrochemical Society", Feb. 22, 2007, pp. H318-H324, vol. 154, No. 4.

Chorley, R. et al., "Subvalent Group 14 metal compounds. The X-ray crystal structures of two monomeric Group 14 metal bisamides, Ge[N(SiMe,)", "Inorganica Chemica Acta", 1992, pp. 203-209, Publisher: Elsevier.

Cole-Hamilton, D., "MOVPE Mechanisms from studies of specially designed and labelled precursors", "Chem. Commun.", 1999, pp. 759-765.

Cummins, Christopher C., et al., "Synthesis of Terminal Vanadium(V) Imido, Oxo, Sulfido, Selenido, and Tellurido Complexes by Imido Group or Chalcogenide", "Inorganic Chemistry", Mar. 30, 1994, pp. 1448-1457, vol. 33, No. 7.

Drake, J. et al., "Studies of Silyl and Germyl Group 6 Species. 5.' Silyl and Germyl Derivatives of Methane- and Benzenetellurols", "Inorg. Chem.", 1980, pp. 1879-1883, vol. 19.

Foley, S. et al., "Facile Formation of Rare Terminal Chalcogenido Germanium Complexes with Alkyllamidinates as Supporting Ligands", "J. Am. Chem", 1997, pp. 10359-10363, vol. 119.

Foley, S. et al., "Synthesis and structural characterization of the first trialylguanidinate and hexahydropyramidinate complexes of tin", "Polyhedron", 2002, pp. 619-627, vol. 21.

Gehrhus, B. et al., "New Reactions of a Silylene: Insertion into M—N Bonds of M[N(SiMe3)2)2 (M = Ge, Sn, or Pb)", "Angew. Chem. Int. Ed. Engl.", 1997, pp. 2514-2516, vol. 36, No. 22.

Gordon, Roy G., et al., "Silicon dimethylamido complexes and ammonia as precursors for the atmospheric pressure chemical vapor deposition of...", "Chem. Mater.", Sep. 1990, pp. 480-482, vol. 2, No. 5.

Green, S. et al., "Synthetic, structural and theoretical studies of amidinate and guanidinate stabilised germanium(I) dimers", "Chem. Commun.", Sep. 8, 2006, pp. 3978-3980.

Green, S. et al., "Complexes of an Anionic Gallium(I) N-Heterocyclic Carbene Analogue with Group 14 Element(II) Fragments: Synthetic...", "Inorganic Chem.", 2006, pp. 7242-7251, vol. 45, No. 18.

Gumrukcu, I. et al., "Electron Spin Resonance of t-Alkyl-, Silyl-, and Germyl-aminyl Radicals and some Observations on the Amides MBr{N(SiMe,)", "J.C.S. Chem. Comm.", 1980, pp. 776-777.

Gupta, A. et al., "Triorganoantimony(V) complexes with internally functionalized oximes: synthetic, spectroscopic and structural aspects...", "Journal of Organometallic Chemistry", 2002, pp. 118-126, vol. 645.

Gynane, M. et al., "Subvalent Group 4B Metal Alkyls and Amides: The Synthesis and Physical Properties of Thermally Stable Amides of...", "J.C.S. Dalton", 1977, pp. 2004-2009.

Han, L. et al., "Extremely Facile Oxidative Addition of Silyl, Germyl, and Stannyl Tellurides and Other Chalcogenides to Platinum(0)...", "J. Am. Chem. Soc.", 1997, pp. 8133-8134, vol. 119.

Harris, D. et al., "Monomeric, Volatile Bivalent Amides of Group IVB Elements, M(NR1,), and M(NR1R2), (M=Ge, Sn, or Pb; R1=Me,Si, R2=Me,C)", "J.C.S. Chem. Comm.", 1974, pp. 895-896.

Hatanpaa, Timo, et al., "Synthesis and characterisation of cyclopentadienyl complexes of barium: precursors for atomic layer deposition of BaTiO3", "Dalton Trans.", 2004, pp. 1181-1188, No. 8.

Herrmann, W. et al., "Stable Cyclic Germanediyls ('Cyclogermylenes'): Synthesis, Structure, Metal Complexes, and Thermolyses,", "Angew. Chem. Int. Ed. Engl.", 1992, pp. 1485-1488, vol. 31, No. 11.

Herrmann, W. et al., "Volatile Metal Alkoxides according to the Concept of Donor Functionalization", "Angew. Chem. Int. Ed. Engl.", 1995, pp. 2187-2206, vol. 34.

Hitchcock, Peter B., et al., "Subvalent Group 14 Metal Compounds-XIII: Oxidative Addition Reactions of Germanium and Tin Amides With Sulphur, Selenium", "Polyhedron", 1991, pp. 1295-1301, No. 7.

Hitchcock, Peter B., et al., "Synthesis and Structures of Bis[ bis( trimethylsilyl)amido] tin (iv) Cyclic Chalcogenides [ {Sn [ N (Si Me,),]...", "J. Chem Soc. Dalton Trans.", 1995, pp. 3179-3187.

Hor, Y. et al., "Superconducting NbSe2 nanowires and nanoribbons converted from NbSe3 nanostructures", "Applied Physics Letters", Sep. 27, 2005, pp. 1425061-1425063, vol. 87.

Hudgens, S. et al., "Overview of Phase Change Chalcogenide non-volatile Memory Technology", "MRS Bulletin", Nov. 2004, pp. 1-5.

Jones, G., et al., "Amino-derivatives of Metuls and Metalloids. Part 2 Amino stannylation of Unsaturated Substrates, and the Infrared...", "J. Chemical Society", 1965, pp. 2157-2165.

Just, O. et al., "Synthesis and Single-Crystal X-ray Diffraction Examination of a Structurally Homologous Series of Tetra-coordinate...", "Inorg. Chemistry", Mar. 9, 2001, pp. 1751-1755, vol. 40.

Kapoor, P. et al., "High surface area homogeneous nanocrystalline bimetallic oxides obtained by hydrolysis of bimetallic m-oxo alkoxides", "J. Mater. Chem.", Jan. 14, 2003, pp. 410-414, vol. 13.

Karsch, H. et al., "Bis(amidinate) Complexes of Silicon and Germanium", "Eur. J. Inorg. Chemistry", 1998, pp. 433-436.

Kim, R., et al., "Structural Properties of Ge2Sb2Te5 thin films by metal organic chemical vapor deposition for phase change memory...", "Applied Physics Letters", 2006, vol. 89, No. 102107.

Kim, S. et al., "Electrical Properties and Crystal Structures of Nitrogen Doped Ge2Sb2Te5 Thin Film for Phase Change Memory", "Thin Solid Films", Oct. 30, 2004, pp. 322-326, vol. 469-470.

Kuchta, M. et al., "Multiple Bonding Between Germanium and the Chalcogens: The Syntheses and Structures of the Terminal Chalogenido . . . ", "J. Chem. Soc. Chem. Commun.", 1994, pp. 1351-1352.

Kuchta, M. et al., "Comparison of the reactivity of germanium and tin terminal chalcogenido complexes: the syntheses of chalcogenolate and . . . ", "Chem. Commun.", 1996, pp. 1669-1670, Publisher: J. Chem. Soc.

Kuhl, O., "N-heterocyclic germylenes and related compounds", "Coordination Chemistry Reviews", 2004, pp. 411-427, vol. 248.

Lappert, M. et al., "Monomeric Bivalent Group 4B Metal Dialkylamides M [NCMe,( CH,),CMe,] (M = Ge or Sn), and the Structure of a Gaseous . . . ", "J.C.S. Chem. Comm.", 1979, pp. 369-370.

Lappert, M. et al., "Monomeric, coloured germanium (II) and tin (II) di-t-butylamides, and the crystal and molecular structure of Ge (NCMe2 . . . ", "J.C.S. Chem. Comm.", 1980, pp. 621-622.

Lee, J. et al., "GeSbTe deposition for the PRAM application", "Applied Surface Science", Feb. 1, 2007, pp. 3969-3976, vol. 253, Publisher: Elsevier.

Leskela, Markku, et al., "Atomic layer deposition chemistry: recent developments and future challenges", "Angew. Chem. Int. Ed.", 2003, pp. 5548-5554, vol. 42.

Macomber, D. et al. , "n5-Cyclopentadienyl- and n5-Pentamethylcyclopentadienyl copper compunds Containng Phosphine, Carbonyl, and n2-Acetyle", "J. Am. Chem.", 1983, pp. 5325-5329, vol. 105.

Maruyama, Toshiro, et al., "Silicon dioxide thin films prepared by chemical vapor deposition from tetrakis (diethylamino)silane and ozone", "Appl. Phys. Letters", May 23, 1994, pp. 2800-2802, vol. 64, No. 21.

Maruyama, Toshiro, "Electrical Characterization of Silicon Dioxide Thin Films Prepared by Chemical Vapor Deposition from . . . ", "Jpn. J. Appl. Phys.", Jul. 15, 1997, pp. L922-L925, vol. 36, No. 7B.

Mathur, S. et al., "Germanium Nanowires and Core-Shell Nanostructures by Chemical Vapor Deposition of [Ge (C5H5)2]", "Chem. Mater.", May 15, 2004, pp. 2449-2456, vol. 16.

Matsuda, I., et al., "Reactions of Group IV Organometallic Compounds", "J. of Organometallic Chem.", 1974, pp. 353-359, vol. 69.

Meller, A., et al., "Synthesis and Isolation of New Germanium (II) Compounds and of Free Germylenes", 1984, pp. 2020-2029, vol. 118 (English Abstract).

Meltzer, N. et al., "Synthesis of a silylene-borane adduct and its slow conversion to a silylborane", "Chem. Commun.", 1996, pp. 2657-2658.

Neumann, W. , "Germylenes and Stannylenes", "Chem. Rev.", 1991, pp. 311-334, vol. 91, Publisher: American Chemical Society.

Oakley, Sarah H., et al., "Structural consequences of the prohibition of hydrogen bonding in copper-guanidine systems", "Inorg. Chem.", 2004, pp. 5168-5172, vol. 43, No. 16.

O'Brien, P. et al., "Single-molecule Precursor Chemistry for the Deposition of Chalcogenide(S or Se)-containing Compound Semiconductors MOCVD", "J. Mater. Chem.", 1995, pp. 1761-1773, vol. 5, No. 11.

Ovshinsky, Stanford R., "Reversible Electrical Switching Phenomena in Disordered Structures", Nov. 11, 1968, pp. 1450-1455, vol. 21, No. 20.

Pickett, N. et al., "Gas-phase formation of zinc/cadmium chalcogenide cluster complexes and their solid-state thermal decomposition to . . . ", "J. Mater. Chem.", 1998, pp. 2769-2776, vol. 8.

Privitera, S. et al., "Phase change mechanisms in Ge2Sb2Te5", "Journal of Applied Physics", Jul. 9, 2007, pp. 0135161-0135165, vol. 102.

Raj, P., et al., "Synthesis and characterization of the complex triorganoantimony (V) captions (CAPLUS Abstract Accession No. 117:48764", "Synthesis and Reactivity in Inorganic and Metal-organic Chemistry", 1992, pp. 543-557 (Only Abstract Provided), vol. 22, No. 5.

Raj, P. et al. , "Triorganoantimony(V) complexes with internally functionallized oximes: synthetic, spectroscopic and structural aspects . . . ", "Journal of Organometallic Chemistry", 1992, pp. 118-126, vol. 645, Publisher: (CAPLUS English Abstract).

Raj, P. et al., "Synthesis and geometry of complex triorganoantimony (V) cations", "Journal of Organometallic Chemistry", 1992, pp. 1471-1494, vol. 22, No. 10, Publisher: (CAPLUS English Abstract).

Ren, H. et al. , "Synthesis and structures of cyclopentadienyl N-heterocyclic carbene copper complexes", "Journal of Organometallic Chemistry", 2006, pp. 4109-4113, vol. 691.

Richardson, M., et al. , "Volatile rare earth chelates of 1,1,1,5,5,5-hexafluoro-2,4-pentanedione and 1,1,1,2,2,3,3,7,7,7-decafluoro-4,6-heptanedi", "Inorganic Chemistry", 1971, pp. 498-504, vol. 10, No. 3.

Ritch, J. et al., "The single molecular precursor approach to metal telluride thin films: imino-bis (diisopropylphosphine tellurides) as . . . ", "Chem. Soc. Rev.", Jun. 27, 2007, pp. 1622-1631, vol. 36.

Sasamori, T. et al., "Reactions of a Germacyclopropabenzene with Elemental Chalcogens: Syntheses and Structures of a Series of Stable 2H- . . . ", "Organometallics", Jan. 14, 2005, pp. 612-618, vol. 24, Publisher: American Chemical Society.

Schlecht, S. et al., "Direct Synthesis of (PhSe)4Ge and (PhTe)4Ge from Activated Hydrogenated Germanium Crystal Structure and Twinning of . . . ", "Eur. J. Inorg. Chem.", 2003, pp. 1411-1415.

Shenai, D. et al., "Safer alternative liquid germanium precursors for relaxed graded SiGe layers and strained silicon by MOVPE", "Journal of Crystal Growth", Jan. 8, 2007, pp. 172-175, vol. 298.

Shi, Y. et al., "Titanium dipyrrolylmethane derivatives: rapid inter,olecular alkyne hydroamination", "Chemical Commun.", Feb. 4, 2003, pp. 586-587, Publisher: Royal Society of Chemistry.

Stauf, G. et al., "Low Temperature ALD of Germanium for Phase Change Memory Thin Films", "AVS 7th International Conference on Atomic Layer Deposition", Jun. 24, 2007, pp. 1-8, Publisher: ALD 2007, San Diego.

Steigerwald, M. et al. , "Organometallic Synthesis of 11-VI Semiconductors: Formation and Decomposition of Bis(organotelluro)mercury and . . . ", "J. Am. Chem. Soc.", 1987, pp. 7200-7201, vol. 109.

Sun, S.C., et al., "Performance of MOCVD tantalum nitride diffusion barrier for copper metallization", "1995 Symp. on VLSI Technol. Digest of Technical Papers", Jun. 1995, pp. 29-30.

Tsai, M.H., et al., "Metalorganic chemical vapor deposition of tantalum nitride by tertbutylimidotris(diethylamido) tantalum for advanced . . . ", "Appl. Phys. Lett.", Aug. 21, 1995, pp. 1128-1130, vol. 67, No. 8.

Tsai, M.H., et al., "Metal-organic chemical vapor deposition of tantalum nitride barrier layers for ULSI applications", "Thin Solid Films", Dec. 1, 1995, pp. 531-536, vol. 270, No. 1-2.

Tsumuraya, T. et al., "Telluradigermiranes. A Novel Three-membered Ring System Containing Tellurium", "J. Chem. Soc. Chem. Commun.", 1990, pp. 1159-1160.

Vehkamaki, Marko, et al. , "Atomic Layer Deposition of SrTiO3 Thin Films from a Novel Strontium Precursor-Strontium-bis(tri-isopropyl cyclopentadien", "Chem. Vapor Dep.", Mar. 2001, pp. 75-80, vol. 7, No. 2.

Veith, M. et al., "Additionsreaktionen an intramolekular basenstabilisierte Ge = N- und Ge = S-Doppelbindungen", "Chem. Ber.", 1991, pp. 1135-1141, vol. 124 (English Abstract).

Veith, M. et al., "New perspectives in the tailoring of hetero (bi and tri-) metallic alkoxide derivatives", "Polyhedron", 1998, pp. 1005-1034, vol. 17, No. 5-6, Publisher: Elsevier.

Veith, M. et al., "Molecular precursors for (nano) materials: a one step strategy", "J. Chem. Soc. Dalton. Trans.", May 20, 2002, pp. 2405-2412.

Veprek, S. et al., "Organometallic chemical vapor deposition of germanium from a cyclic germylene, 1,3-Di-tertbutyl-1,3,2-diazagermolidin . . . ", "Chem. Mater.", 1996, pp. 825-831, vol. 8, Publisher: American Chemical Society.

Weller, H., "Colloidal Semiconductor Q-Particles: Chemistry in the Transition Region Between Solid State and Molecules", "Angew. Chem. Int. Ed. Engl.", 1993, pp. 41-53, vol. 32.

Weller, H., "Self-organized Superlattices of Nanoparticles", "Angew. Chem. Int. Ed. Engl.", 1996, pp. 1079-1081, vol. 35, No. 10.

Auner, N., et al. "Organosilicon Chemistry IV: From Molecules to Materials", Mar. 2000, p. 291, Publisher: Wiley-Vch.

Cheng, H., et al., "Wet Etching of GE2SB2TE5 Films and Switching Properties of Resultant Phase Change Memory Cells", "Semiconductor Science and Technology", Sep. 26, 2005, pp. 1111-1115, vol. 20, No. 11.

* cited by examiner

GeTe

GeSbTe

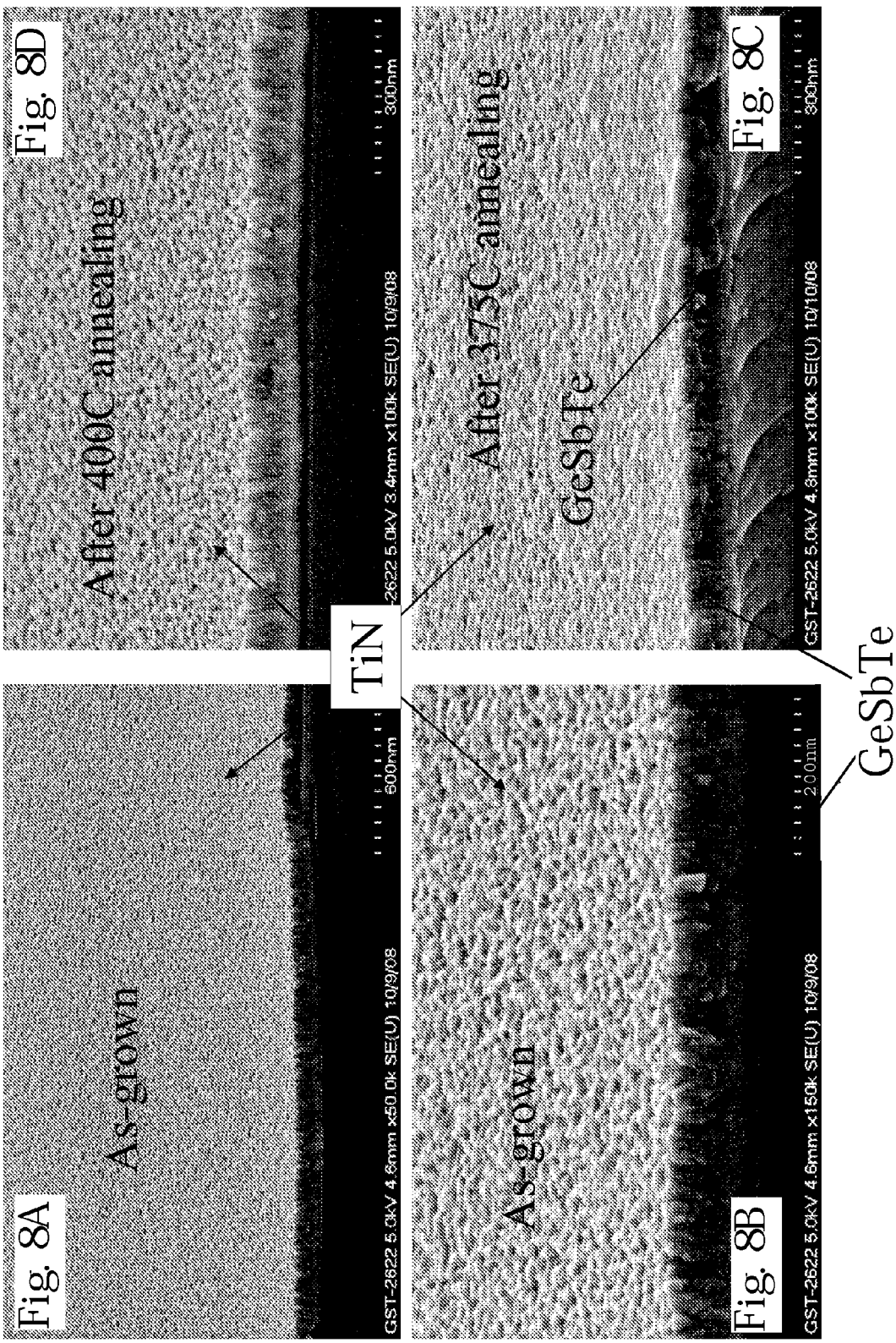

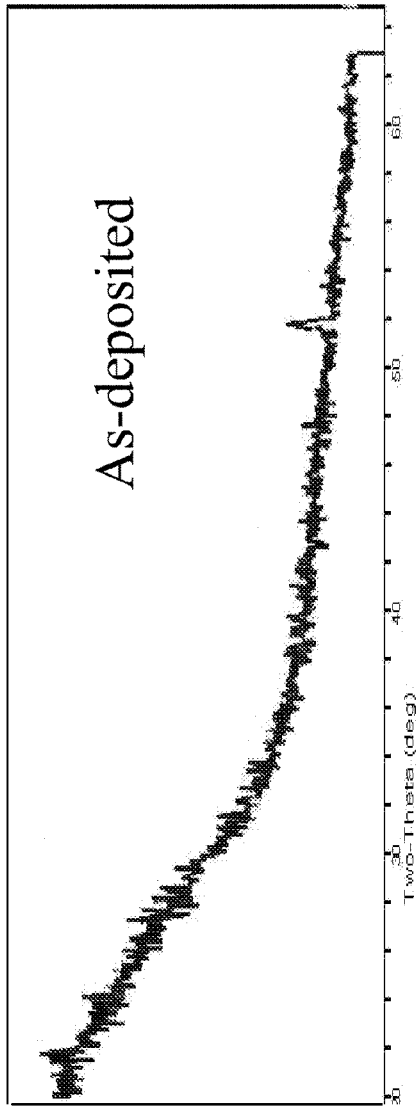
Fig. 9a X-Ray diffraction of GeTe as-deposited (370Å Ge 58.5% and Te 41.5%)
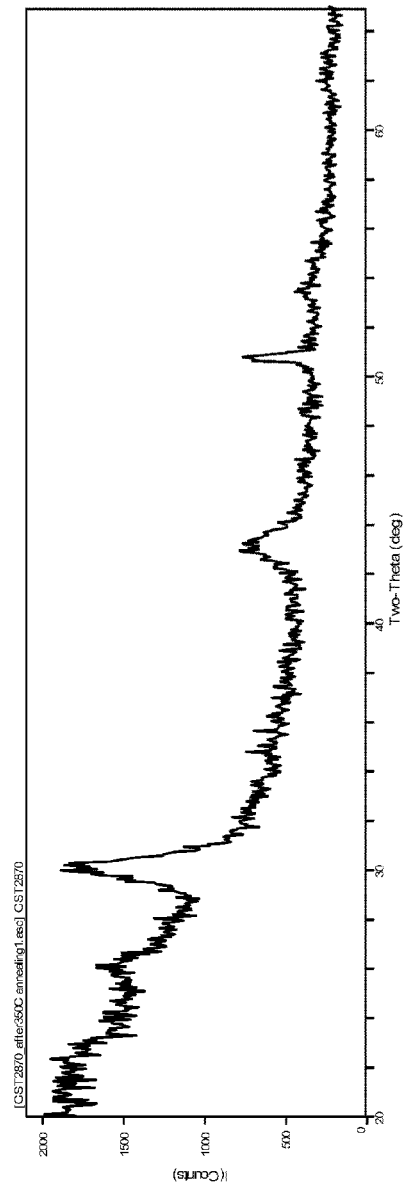
Fig. 9b X-Ray Diffraction of GeTe film after annealing at 350°C for 45min

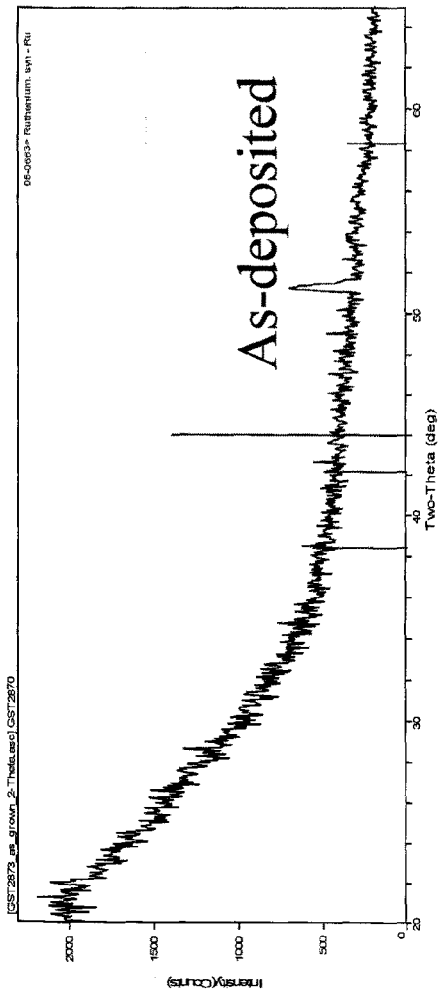
Fig. 10a X-ray Diffraction of GST film as-deposited (309A, Ge 51.9%, Sb 3.9%, Te 46.3%)
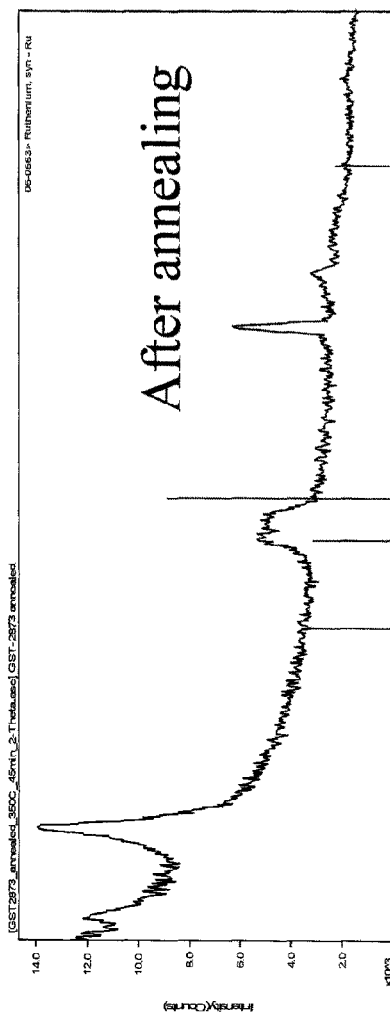
Fig. 10 b X-ray Diffraction of GST film after annealing at 350°C for 45min (309A, Ge 51.9%, Sb 3.9%, Te 46.3%)

HIGH CONCENTRATION NITROGEN-CONTAINING GERMANIUM TELLURIDE BASED MEMORY DEVICES AND PROCESSES OF MAKING

CROSS-REFERENCE TO RELATED APPLICATIONS

This application is a U.S. national phase under the provisions of 35 U.S.C. §371 of International Patent Application No. PCT/US09/66805 filed Dec. 4, 2009, which in turn claims the benefit of priority of: U.S. Provisional Patent Application No. 61/120,238 filed Dec. 5, 2008; U.S. Provisional Patent Application No. 61/158,848 filed Mar. 10, 2009; and U.S. Provisional Patent Application No. 61/166,918 filed Apr. 6, 2009. The disclosures of such international patent application and each of the aforementioned U.S. provisional patent applications are hereby incorporated herein by reference in their respective entireties, for all purposes.

TECHNICAL FIELD

The present invention relates to phase change memory devices and processes of making such devices and, more particularly, to phase change memory devices that utilize germanium telluride containing high amounts of nitrogen. The present invention also particularly relates to processes of making phase change memory devices using chemical vapor deposition techniques.

BACKGROUND OF THE INVENTION

Phase change memory (PCM) devices are positioned to replace traditional types of dynamic random access memory (DRAM) and are currently deposited through the use of physical vapor deposition methods, such as sputtering. PCM devices are fast approaching their physical limits with regard to speed and density within planar structures. Therefore, there is an increasing need to deposit films that allow deposition onto non-planar structures, thereby achieving higher density and speed within the device. Germanium telluride based materials are the basis for PCM devices and are of the general formula $Ge_xTe_y$. When antimony is included as a dopant in the material, the general formula is $Ge_xSb_yTe_z$.

By adding nitrogen to PVD sputtering processes, one can provide for the incorporation of nitrogen into $Ge_xSb_yTe_z$ films with concentrations of up to 15% nitrogen. These nitrogen-incorporated films, in general, have crystallization temperatures that are at least about 50 degrees greater than the crystallization temperatures of $Ge_xSb_yTe_z$ films without nitrogen incorporation. Such nitrogen-incorporated films also have lower crystalline phase conductivities when compared to the $Ge_xSb_yTe_z$ films not having nitrogen. Furthermore, these films generally crystallize at temperatures as low as 200 degrees C., while the desired deposition temperatures for achieving amorphous as-deposited films by CVD or atomic layer deposition (ALD) processes, may be much higher. By depositing such films below the film crystallization temperature, one can produce amorphous thin-films without the typical roughness, poor conformality and/or poor filling of small hole structures (vias), associated with as-deposited crystalline PCM films. Therefore, the direct deposition of amorphous PCM films is highly advantageous.

Some of the nitrogen of the deposited films may be in the form of GeN. In a CVD or ALD process, a portion of the nitrogen not in GeN form is out-diffused or expelled during the post CVD or ALD deposition annealing, depending on the annealing temperature. The annealing facilitates either a phase transformation to the crystalline phase or in keeping the film in the amorphous phase (annealing at a temperature higher than the phase change temperature causes crystallization, and annealing at a temperature lower than the phase change temperature allows the film to remain amorphous). Keeping the film in the amorphous phase leads to the formation of $Ge_xSb_yTe_z$ films having relatively low nitrogen content, such films exhibiting similar structures and device behaviors to that of known $Ge_xSb_yTe_z$ films deposited by PVD. While low amounts of nitrogen are desirable in such films, suitably conformal amorphous films are difficult or impossible to produce without higher amounts of nitrogen to help raise the phase change temperature in CVD or ALD deposition processes.

Making the Ge:Te ratio less than the ideal 1:1 ratio (for stoichiometric GeTe) will also increase the crystallization temperature. This is because an imbalance in the components resulting in excess amounts of Ge will cause the GeTe to act as if there are extrinsic materials that add friction to the crystallization process, thereby increasing the crystallization temperature. Adding nitrogen alone to a $Ge_xSb_yTe_z$ film is not sufficient to increase the crystallization temperature of the $Ge_xSb_yTe_z$ film; however, the reaction of the excess Ge (due to the imbalance between the Ge and Te) with nitrogen in the post deposition annealing leads to more GeN formation and thus purposely promotes the balance of the Ge:Te. Accordingly, the crystallization temperature can then be reduced when compared to an as-deposited film, before annealing.

SUMMARY OF THE PRESENT INVENTION

In one aspect, the present invention resides in a PCM device having an as-deposited film having the composition $Ge_xTe_yN_zA_m$ deposited onto a substrate, where x is about 40% to about 60%, y is about 30% to about 49%, and z is about 5% to about 40%. After annealing, z is substantially reduced to about 5% to 15%. The component represented as A is an optional dopant and representative of at least one of the following elements of Sb, Sn, In, Ga, and Zn, and m is about 5% to 20%. As for Sb specifically, m is preferably below about 5%. The present invention is not limited to the foregoing listed dopants, however, since A may be representative of another element. Combinations of the foregoing dopants are also within the scope of the present invention. The higher nitrogen content in the as-deposited film allows for the substantially void free and substantially conformal deposition of the film onto the substrate, and the composition in the form of an annealed film will have up to a 40% reduction in nitrogen content for optimal device performance.

In another aspect, the present invention resides in a CVD process for depositing a PCM material onto a substrate. In this process, at least one of a Ge-based precursor and a Te-based precursor in vapor form is delivered to a CVD chamber. At least one co-reactant is also delivered to the CVD chamber simultaneously with the at least one precursor. Exemplary co-reactants that may be delivered include, but are not limited to, $NH_3$ and $H_2$. Inert gases such as Ar, $N_2$, He, and combinations of the foregoing may also be used during the process for carrying precursors and the like. The CVD chamber is heated and pressure in the chamber is reduced, and a film having at least one of Ge and Te is deposited onto the substrate. This film is high in density and substantially void free (and remains substantially void free). The film is also substantially conformal with regard to topographical features of the substrate such that vertically oriented vias and similar structures that are not masked will be filled so as to be substantially void free during deposition of the film. Dopants may also be delivered with the precursors. The present invention is not limited to deposition by any particular type of CVD, however, as the precursors (and dopants) can be deposited using methods such as MOCVD (metal oxide chemical vapor deposition), DCVD (digital CVD), and atomic layer deposition (ALD).

In another aspect, the present invention resides in a process for fabricating a phase change device. In this process, a PCM material is deposited onto a substrate using a CVD process. The PCM material may comprise $Ge_xTe_yN_zAm$ in the form of a film, where x is about 40% to about 60%, y is about 30% to about 49%, z is about 5% to about 40%, and m is about 0% to about 20%. When A is Sb, m is preferably below about 5%. The PCM material is substantially conformally deposited with regard to a topographical feature of the substrate to form a PCM structure. The deposited PCM material is also substantially void-free. The film can then be annealed prior to a polish process. Annealing can be accomplished under varying conditions with varying inert and co-reactant gases. The polish process removes some material using a chemical mechanical polish (CMP) material and method. Carrying out the annealing process prior to CMP allows the top layer materials (due to composition depleting by out diffusion) or any oxide surface formed during annealing to be polished away. The annealing process further reduces the amount of nitrogen in the film and transforms the $Ge_xTe_yN_zAm$ to an alloy of $Ge_xTe_yN_{z'}Am$ and GeN, where z' is substantially lower than z. The present invention is not limited in this regard, however, as the annealing may be conducted after CMP and any sequential metal contact processes.

As used herein, PCM can be used for a non-volatile memory with expected scalability down to sub-10 nanometer (nm) dimensions and has applicability in NOR, NAND, DRAM, and embedded device applications. This is a CVD-based confined-cell technology that advantageously enables increased scaling and cost reduction for future generation products. As used herein, confined cell technology refers to three-dimensional structures that allow for fast write-times and high density packing of bits with low reset current and power, thereby making PCM increasingly competitive with regard to applications in high performance Flash and DRAM products as compared to existing Flash and DRAM applications. The CVD precursors enable the use of CVD technologies for deposition into small, high aspect ratio structures consistent with the confined cell technology. In the above-described embodiments, the PCM composition is substantially amorphous as deposited. Also, the use of CVD as a high volume conformal process to extend the speed and density limitations of current forms of electronic memory allows for the development of PCM devices having improved scalability and lower cost.

Nitrogen-rich $Ge_xTe_yN_z$ or $Ge_xTe_yN_{z'}$ with the dopant also provides for improved adhesion to nitrogen containing metal electrode films such as TaN, TiAlN or TiN because of the existence of the nitrogen content and GeN precipitates. Furthermore, the nitrogen-rich $Ge_xTe_yN_z$ and GeN provides for improved adherence to TiN or TiAlN when compared to Ge, Te, germanium, telluride, or $Sb_2Te_3$.

BRIEF DESCRIPTION OF THE DRAWINGS

FIG. 8A is an image of high Ge and high Te GST film adhesion.

FIG. 8B is an image of the film of FIG. 8A at another resolution.

FIG. 8C is an image of the film of FIGS. 8A and 8B after annealing at a first temperature.

FIG. 8D is an image of the film of FIGS. 8A and 8B after annealing at a second temperature.

FIG. 9A is an x-ray diffraction scan of GeTe film before annealing.

FIG. 9B is an x-ray diffraction scan of the GeTe film of FIG. 9A after annealing.

FIG. 10A is an x-ray diffraction scan of GST film before annealing.

FIG. 10B is an x-ray diffraction scan of the GST film of FIG. 10A after annealing.

DETAILED DESCRIPTION OF THE PREFERRED EMBODIMENTS

Figure 1:
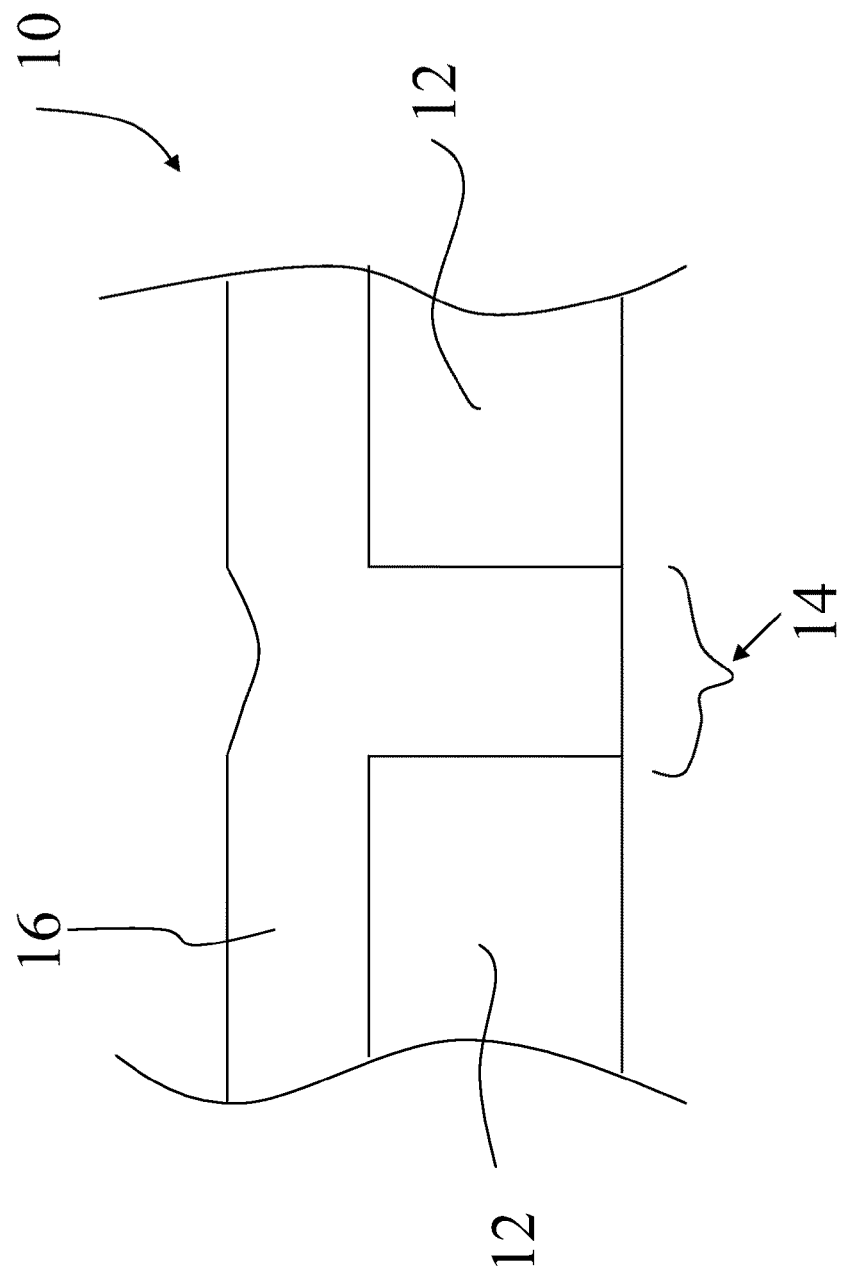
FIG. 1 is a schematic representation of a germanium telluride film of the present invention on a substrate.

Unless otherwise noted, all percentages are atomic percentages.

The present invention allows for the chemical vapor deposition (CVD) of nitrogen-containing germanium telluride materials onto suitable substrates to form phase change memory (PCM) devices. These germanium telluride materials include, but are not limited to, films of the formula $Ge_xTe_yN_z$ in which the germanium and telluride form amorphous thin-films and in which the nitrogen is of a suitable amount and located within the film structure. In some embodiments, the films may incorporate one or more other elements as dopants, such elements including but not being limited to antimony (Sb), indium (In), gallium (Ga), zinc (Zn), or tin (Sn). In one exemplary embodiment, the film as deposited is $Ge_xTe_yN_zA_m$, where x is about 40% to about 60%, y is about 30% to about 49%, z is about 5% to about 40%, preferably about 10% to about 30% and more preferably about 5% to about 15%, A is representative of the Sb, Sn, In, Ga, and/or Zn as the dopant, and m is up to about 15% (preferably up to about 5% for Sb).

Precursors, co-reactants, and dopants are used to facilitate the deposition of the CVD films. Precursors for the Ge include, but are not limited to, germanium butylamidinate, Ge-based complexes such as $Ge^{(II)}(R^1R^2)$ and $Ge^{(IV)}(R^1R^2R^3R^4)$, $R^3Ge-GeR^3$, and the like as well as combinations of the foregoing. Precursors for the Te include, but are not limited to, di-tert-butyl telluride, Te-based compounds such as $Te(R^1R^2)$, $RTe-TeR$, and the like as well as combinations of the foregoing. When Sb is used as the dopant, one exemplary Sb compound can be Sb(R$^1$R$^2$R$^3$). Exemplary precursors and dopants include, but are not limited to:
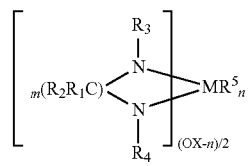
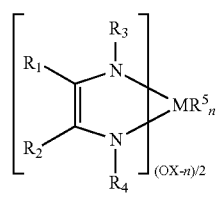
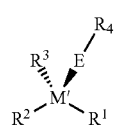
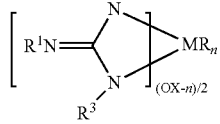
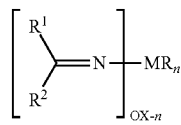
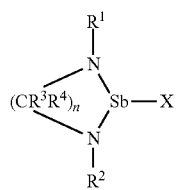
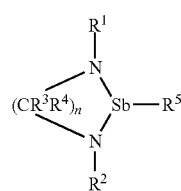
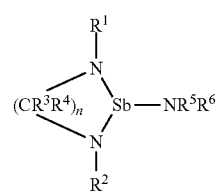
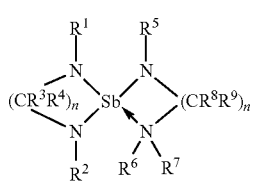
-continued
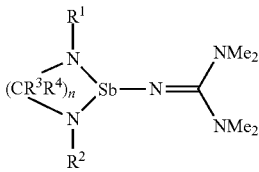
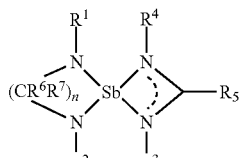
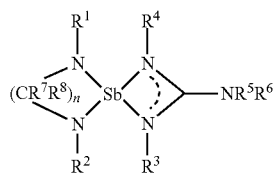
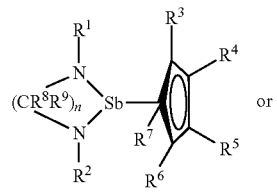
or
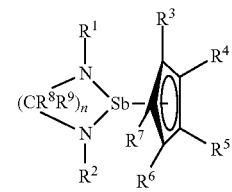
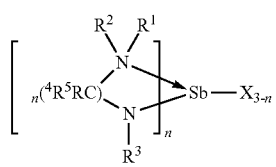
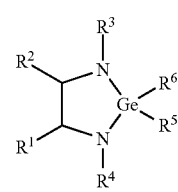
V
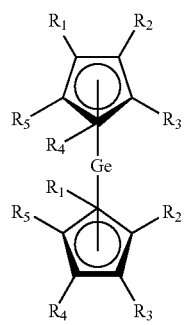

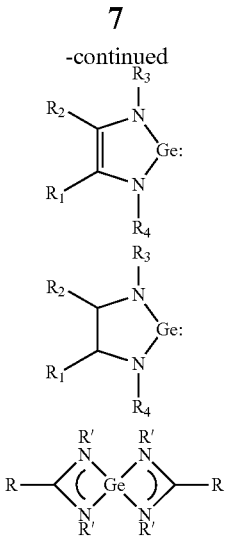

In any of the foregoing complexes and compounds, R is independently selected from among H, amidinate, guanidinate, $C_1$-$C_6$ alkyl, $C_3$-$C_6$ cycloalkyl, $C_1$-$C_6$ alkoxy, —$NR^1R^2$, —$C(R^3)_3$, —$Si(R^8)_3$, and —$Ge(R^8)_3$ wherein each $R^3$ is independently selected from $C_1$-$C_6$ alkyl and each $R^8$ is independently selected from among H, $C_1$-$C_6$ alkyl, $C_5$-$C_{10}$ cycloalkyl, $C_6$-$C_{10}$ aryl, and —$Si(R^9)_3$ and each $R^9$ is independently selected from $C_1$-$C_6$ alkyl. E is a chalcogenide (S, Se, Te).

In fabricating the PCM devices of the present invention, one Ge precursor that may be used is germanium butylamidinate (germanium bis(n-butyl, N,N-diisopropylamidinate). Furthermore, one Te precursor is di-tert-butyl telluride. Any of the precursors for use in the present invention may be in either solid or liquid form, but are vaporized for transport and reaction to form the film. Co-reactants, which may be $NH_3$ and/or hydrogen gas, may also be added. However, the present invention is not limited in this regard, as the precursors and the co-reactants may be other materials. Methods of delivery include, but are not limited to, evaporative processes (e.g., ProE-Vap™ (Process Efficiency Vaporizer, a method of delivering solid precursors via atomic layer deposition)), bubbler methods, and liquid delivery approaches. For delivery of the precursor in either solid or liquid form, the precursor is dissolved in a suitable solvent such as an alkane, an alkanol, an ether, or tetrahydrofuran (THF). For liquid delivery, the preferred organic solvents are hydrocarbons, such as, hexane, octane, and toluene. The present invention is not limited in this regard, however, as other materials are within the scope of the disclosed embodiments.

Other precursors for the deposition of Ge, Te, Sb that may be useful in the deposition processes for GST films as disclosed herein include, but are not limited to, those disclosed in International Patent Application PCT/US07/63832 filed on Mar. 12, 2007, entitled "Low Temperature Deposition of Phase Change Memory Materials Via CVD/ALD"; International Patent Application PCT/US07/63830 filed on Mar. 12, 2007, entitled "Antimony and Germanium Complexes Useful for CVD/ALD of Metal Thin Films"; U.S. patent application Ser. No. 12/239,808 filed on Sep. 28, 2008, now published as U.S. Patent Application Publication No. 2009/0087561A1, entitled "Metal Silylamides, Ketimates, Tetraalkylguanidinates and Dianionic Guanidinates Useful for CVD/ALD of Thin Films"; U.S. patent application Ser. No. 12/392,009 filed on Feb. 24, 2009, now published as U.S. Patent Application Publication No. 2009/0215225A1, entitled "Tellurium Compounds Useful for Deposition of Tellurium Containing Materials"; U.S. patent application Ser. No. 12/434,485 filed on May 1, 2009, published as U.S. Patent Application Publication No. 2009/0275164A1, now abandoned, entitled "Bicyclic Guanidinates as CVD/ALD Precursors"; U.S. patent application Ser. No. 12/263,403 filed on Oct. 31, 2008, now issued as U.S. Pat. No. 8,093,140, entitled "Amorphous Ge/Te Deposition Process Preferred GeM Process"; and International Patent Application PCT/US09/42290 filed on Apr. 30, 2009, entitled "Antimony Compounds Useful for Deposition of Antimony-Containing Materials," the contents of all of the foregoing applications being incorporated herein by reference in their entireties.

The high nitrogen content in the films of the present invention allows for the robust conformal deposition of amorphous $Ge_xTe_yN_z$ in high aspect ratio structures. As used herein, any film that is conformally deposited is one that substantially conforms (e.g., closely approximates except for minor imperfections) to the contours of the topographical features on which the film is deposited. High aspect ratio structures include, but are not limited to, those having topographical features in which the diameters of holes or vias defining specific morphologies on which the films are deposited is about 40 nm and the aspect ratio is about 5:1 (see FIG. 2C). The higher nitrogen content increases the crystallization temperature of the film to be more than about 280-320 degrees C. and facilitates the conformal deposition of amorphous films. This crystallization temperature is the temperature at which the film transforms from an amorphous state to a crystalline state. In the amorphous phase, the film exhibits a higher resistivity (lower conductivity), whereas in the crystalline phase the film exhibits a lower resistivity (higher conductivity).

After the CVD of the $Ge_xTe_yN_z$ (with or without the dopant), the film may be annealed. Post deposition annealing of the film as deposited will substantially lower z to about 5% to about 15% and preferably to about 5% to about 10%. The post deposition annealing is carried out at temperatures up to about 400 degrees C., with about 350 degrees C. being preferred.

Post CVD processes of the present invention also provide for a modified annealing process that re-distributes or drives out nitrogen from inside the germanium telluride lattice structures of the deposited films. The processing of the films also involves the optional reaction of nitrogen to form GeN and thereby allowing the remaining Ge to form germanium telluride of a particular stoichiometric ratio ($Ge_xTe_y$), typically close to 1:1, that provides for desirable and preferred phase transformation. The present invention is not limited to CVD, however, as MOCVD, digital CVD, and ALD are within the scope of the present invention. In the present invention, when the Ge:Te ratio is as high as 55:45 and after annealing at 325-350 degrees C. for 0.5-1 hour, a low resistive crystalline material (about 0.002-0.004 ohm-cm) with a nitrogen content of less than about 10% is obtained, even with a nitrogen concentration as high as about 20% or more for the as-deposited film. In accordance with the present invention, films produced by the processes described herein also exhibit high resistivity in the amorphous phase while having low resistivity in the crystalline film. As used herein, "low resistivity" in the crystalline phase means that the resistivity is less than about 0.1-0.01 ohm-cm. The "high resistivity" in the amorphous film is one in which the resistivity is greater than about 10-100 ohm-cm. Also as used herein, "high nitrogen" means that the nitrogen content is greater than about 15%. In some embodiments of the present invention, the nitrogen content may be as high as about 40%. In the processes described herein, nitrogen in the $Ge_xTe_y$ film may form GeN as a result of molecular nitrogen in the formed $Ge_xTe_y$ lattice structure or via dis-proportionation of the nitrogen within the as-deposited film upon annealing.

When depositing the $Ge_xTe_y$ films using the CVD processes of the present invention, a substrate material is located in a CVD chamber, the interior portion of which is heated, and allowed to equilibrate at a temperature suitable for the CVD process. Substrates that may be used include, but are not limited to, silicon oxides. At least two precursors are introduced into the chamber. Suitable co-reactants are also introduced.

In one method of introducing the precursors in solid form using a vaporizer delivery system, the precursors are sublimed. Such a system includes a plurality of vertically stacked containers that hold the precursors. In this system, a flow of carrier gas is provided through an ampoule in which the vertically stacked containers are located. Each container includes a passageway that allows for the movement of the carrier gas through the ampoule in a tortuous path. The carrier gas and the sublimed precursor are then delivered to the CVD chamber.

Once the precursor(s) and the co-reactants are delivered to the CVD chamber, the actual deposition of the film onto the substrate is carried out at a temperature of about 280 degrees C. to about 350 degrees C. and at a pressure of about 0.5 to about 15 Torr. Preferably, the deposition takes place at a pressure of about 0.8 to about 8 Torr.

The present invention is not limited to $Ge_xTe_y$ films, however, as materials may be used to dope the films with corresponding precursors as indicated herein. Doping with Sb can be effected using an antimony precursor such as tris(dimethylamido)antimony. Doping with Sb to $Ge_xTe_yN_z$ (thereby forming germanium antimony tellurides (GST)) during deposition at the same process window set for $Ge_xTe_yN_z$ will not change the characteristics of the conformal amorphous deposition of $Ge_xTe_yN_z$ as long as the amount of added Sb precursor is between 0.1% and 20% and more preferably 0.5% to 5% and does not adversely affect the process of manufacturing the $Ge_xTe_yN_z$. Using Sb as the dopant may form $Sb_mTe_n$, alloy (one example of the stoichiometric ratio of m:n could be 2:3) inside the matrix of $Ge_xTe_yN_z$. Upon annealing, germanium telluride, antimony (III) telluride ($Sb_2Te_3$), GeN, or the like may be obtained depending on the starting composition. Added specified amounts of Sb may increase the conductivity to be more than that of $Ge_xTe_yN_z$, which may result in an alloy that, when incorporated into a device, is even faster. However, increasing the Sb beyond 5% may increase resistivity beyond desirable values. Elements other than Sb may also be used as long as they are compatible for the growth of the film and for PCM application. Possible elements include, but are not limited to, Sn, In, and the like. Combinations of dopant elements are also within the scope of the present invention.

Referring now to FIG. 1, a $Ge_xTe_y$ film doped with Sb (GST film) as deposited onto a substrate is shown generally at 10. The structure depicted is not limited to the film being a GST film, however, as the film could be deposited without Sb, or it may include other elements, or other elements in addition to Sb. The Sb (and/or other dopant) can be transported in vapor form and derived from corresponding precursors. In the case of Sb, the corresponding precursor may be tris(dimethylamido)antimony. The substrate 12 includes holes, vias, trenches, or other topographical features. A via 14 is shown in the substrate 12. The film, shown at 16, is amorphous and conformally deposited into the via 14 as well as on any other topographical features. Irrespective of the composition of the film 16, the components thereof can be deposited in any combination and in any order. For example, the Sb (or other dopant) could be deposited with the $Ge_xTe_y$, or it could be deposited with either or both the Ge and the Te individually.

Figure 2B:
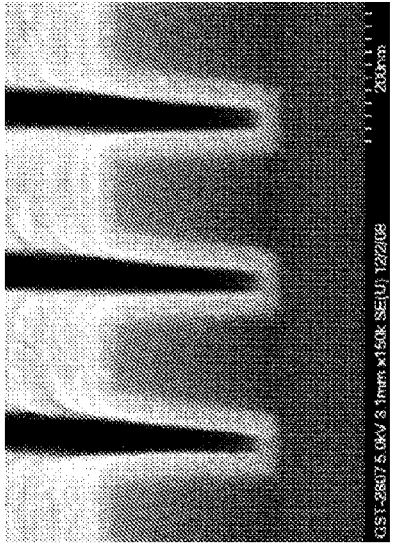
FIG. 2B is a cross-sectional image of the conformal deposition of germanium telluride.
Figure 2A:
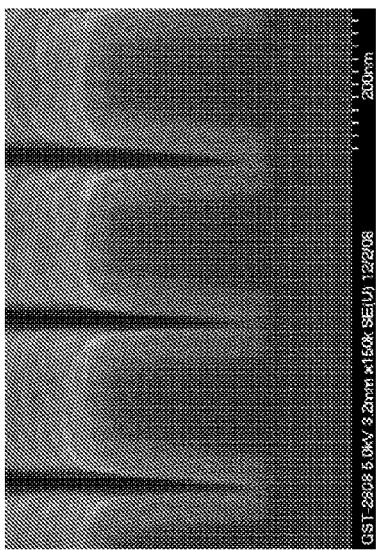
FIG. 2A is a cross-sectional image of the conformal deposition of GST.
Figure 2C:
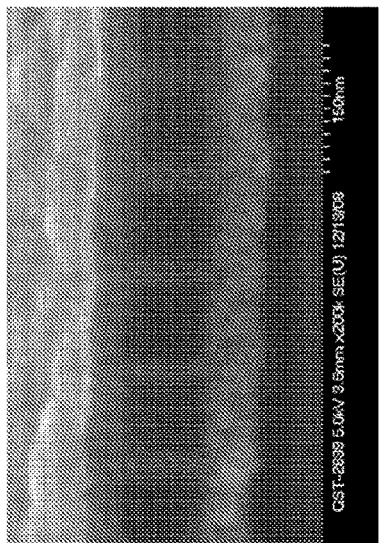
FIG. 2C is an image of cleaved cross-section of void free GST filled 40 nm 5:1 aspect ratio via structure.

The CVD processes of the present invention are scalable to sub-20 nm dimensions (and preferably down to sub-10 nm dimensions) and exhibit conformal filling of high aspect ratios, high densities, and three-dimensional structures. Referring now to FIGS. 2A and 2B, it can be seen that germanium telluride deposition with and without Sb can be suitably conformal at the foregoing dimensions. In FIG. 2A, the composition of the film is 50.9% Ge, 9.7% Sb, and 39.4% Te. In FIG. 2B, the composition of the film is 63.3% Ge and 34.4% Te. In FIG. 2C, the cleaved cross-section image of GST filled 45 nm 5:1 aspect ratio via structure is shown as being void free. The composition of the film is Ge 49%, Sb 9%, and Te 41.0%. As used herein, the term "void free" means that no (or very few) voids are present or can be detected.

After deposition of any type of film (germanium telluride or germanium telluride doped with another element), the substrate 12 is subjected to annealing to cause the out diffusion of nitrogen and/or the reaction of the nitrogen with germanium. In one specific example, the annealing is carried out by slowly heating and slowly cooling the substrate at atmospheric pressure or sub-atmospheric pressure in an inert environment. During annealing, an oxidized surface may be formed on the surface of the film, or there may be some depletion of elements such as Te near the surface. A chemical mechanical polish (CMP) process is generally then carried out to remove the deposited film down to the top horizontal surface of the substrate 12. In performing the annealing prior to the CMP process, the nitrogen can be driven out at maximum possible temperature and time duration without significant concern for surface oxidation or depletion of elements in the film. A subsequent CMP process will remove materials such as surface oxidation and at least the top portions of materials with depleted elements. By annealing the film for 1 hour at about 350 degrees C. and in the presence of an inert gas (e.g., nitrogen) under pressure prior to the CMP process, the nitrogen content can be reduced by 30-50% (relative concentration) as shown in Table 1. The amorphous GST may transform into crystalline GST as evidenced (1) by a change in the X-ray diffraction pattern (FIG. 10A and FIG. 10B) and (2) by resistivity reduction as can be seen in Table 6. The annealing may also be carried out to further reduce nitrogen content by employing a longer time annealing while the annealing temperature may be at or below the phase change temperature (for example, below 325 degrees C.) of the GST deposition temperature, as evidenced in Table 1. Prolonged annealing may be further carried out at temperature substantially lower than the GST deposition temperature and may be at a pressure lower than atmospheric pressure. The annealing environment can be an inert gas environment. The present invention is not limited to annealing before the CMP process, however, as the CMP process may be carried out prior to annealing.

Annealing may also promote nitrogen reacting with Ge to form GeN, thus effectively reducing the Ge available to form $Ge_xTe_y$ and increasing the ratio of Ge:Te to be closer to a stoichiometric ratio of 1:1. As Ge:Te approaches 1:1, the phase transformation temperature from the amorphous to the crystalline phase is lowered. This may increase the speed of the device in which the $Ge_xTe_y$ film is incorporated due to the stoichiometric ratio of Ge:Te being of lower resistivity and facilitating the phase transformation to a greater extent than films having Te:Ge that is not stoichiometric.

The annealing effectively reduces the amount of nitrogen in the film and transforms the $Ge_xTe_yN_z$ to an alloy of $Ge_x$-

Figure 3:
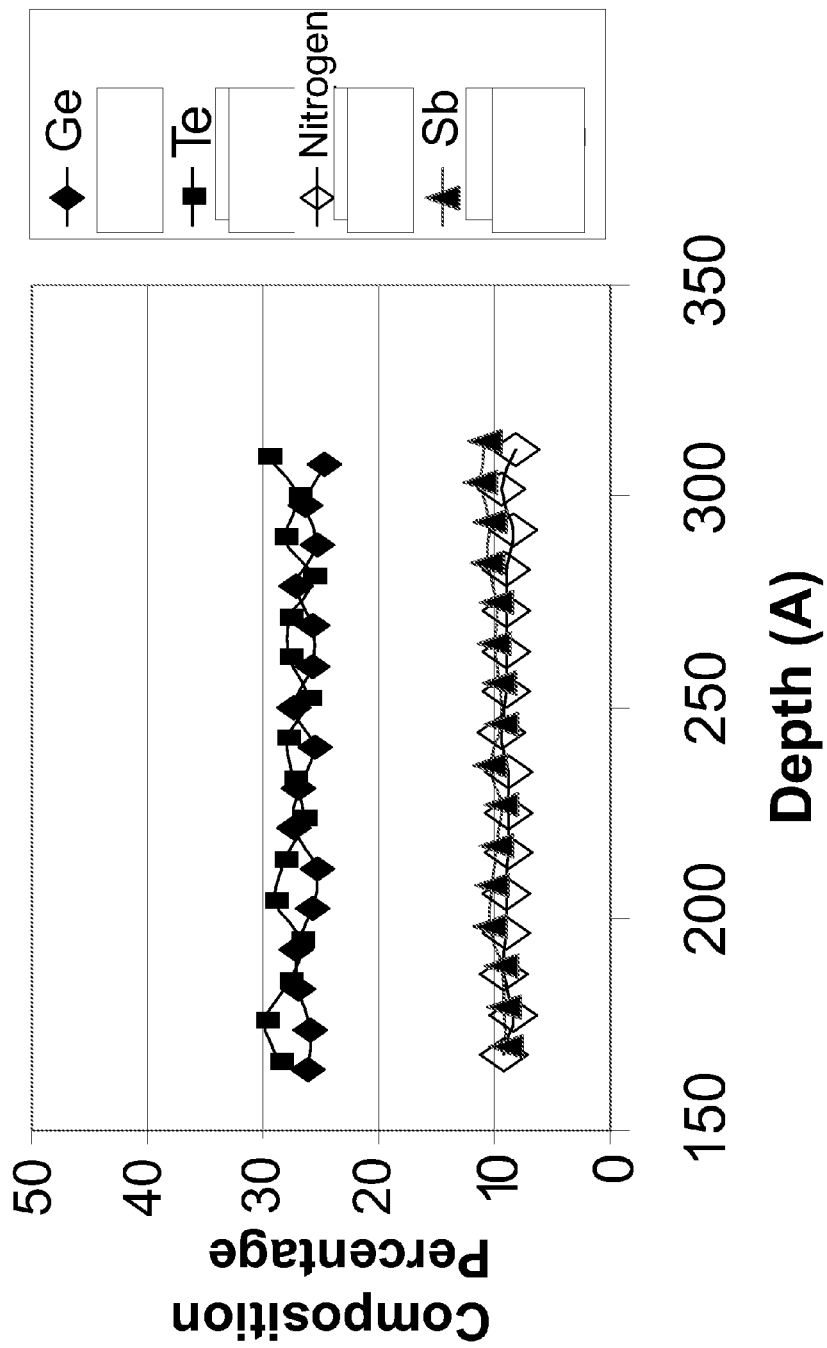
FIG. 3 is a graphical representation of a SIMS (secondary ion mass spectroscopy) measurement of Ge rich GST compared to Sb rich GST.

$Te_yN_{z'}$+GeN, in which z' is substantially lower than z (e.g., z' is up to about three times lower than z). After annealing, the endurance of PCM devices built utilizing the CVD processes of the present invention demonstrate in excess of about $10^7$ write cycles. The new $Ge_xTe_yN_{z'}$ then has a phase transformation temperature lower than that of the original $Ge_xTe_yN_z$. The GeN formed during annealing may precipitate and become embedded in the matrix of $Ge_xTe_yN_{z'}$. GeN precipitated and embedded into the matrix of the $Ge_xTe_yN_{z'}$ has less of an effect on the overall conductivity of the $Ge_xTe_yN_{z'}$ than does evenly distributed nitrogen or GeN in the $Ge_xTe_yN_{z'}$. In particular, the conductivity of the $Ge_xTe_yN_{z'}$ is reduced when GeN is precipitated and embedded in the matrix. This reduced resistivity in the $Ge_xTe_yN_{z'}$ crystalline film is advantageous for high speed devices. Referring to FIG. 3, a comparison of Ge-rich GST and Sb-rich GST is shown. Using secondary ion mass spectroscopy (SIMS), it can be seen that the amount of nitrogen is reduced to about 10% (from 14%-16%), which is a reduction of about 30-40% (relative concentration) from as-deposited film achieved by annealing at about 325 degrees C.

High amounts of nitrogen (e.g., greater than about 15% and sometimes greater than about 30%) along with deficiencies of Te in stoichiometric $Ge_xTe_y$ increase the crystallization temperature of the $Ge_xTe_y$ film, which prevents the $Ge_xTe_y$ crystallization during high temperature deposition in the temperature range of about 280-320 degree C. By preventing the crystallization of $Ge_xTe_y$ crystallization, the conformal decomposition of $Ge_xTe_y$ film can be facilitated. Also $Ge_xTe_y$ is deposited at Te deficient conditions instead of stoichiometric germanium telluride conditions (conditions under which the Ge to Te ratio is 1:1) as an additional way to increase crystallization temperature to prevent crystallization. When nitrogen is sufficiently high in the range of 10-40 atomic %, upon prolonged (1 hour or more) annealing at a temperature equal to or higher than that at the CVD growth temperature, nitrogen may out diffuse to reduce the nitrogen content and may react with Ge to form GeN, and the GeN may precipitate The bonding of nitrogen to Ge is an effective way to reduce Ge in $Ge_xTe_y$ film and may make the remaining Ge atoms balance with Te atoms for a perfect or near perfect stoichiometric germanium telluride alloy. The formation of crystalline germanium telluride alloy, which has low solid solubility for molecular nitrogen in the germanium telluride lattice, would also expel unbonded nitrogen from the $Ge_xTe_y$, thereby reducing the nitrogen content of the low density amorphous $Ge_xTe_y$ materials (in which there is room for nitrogen from the grain boundary and loosely coordinated net of Ge and Te atoms to be accommodated). The ending results are crystalline germanium telluride materials with perfect or near perfect stoichiometric ratios and with embedded GeN clusters. The crystalline germanium telluride film intrinsically has a much lower crystallization/amorphous phase transformation temperature and lower electrical resistivity.

Germanium telluride with GeN clusters may have electrical conductivity as high as that of pure germanium telluride in the crystalline state and resistivity as high as that of amorphous germanium telluride because the precipitated GeN has limited impact on the passage of electron conductivity in the crystalline phase and because the insulating GeN does not contribute to the conductivity when the germanium telluride is in a non-conducting amorphous phase. The present invention is not limited in this regard, however, as the same concepts apply when the GeN is in a GST film or a $Ge_xTe_y$ film having a different doping agent.

Figure 4:
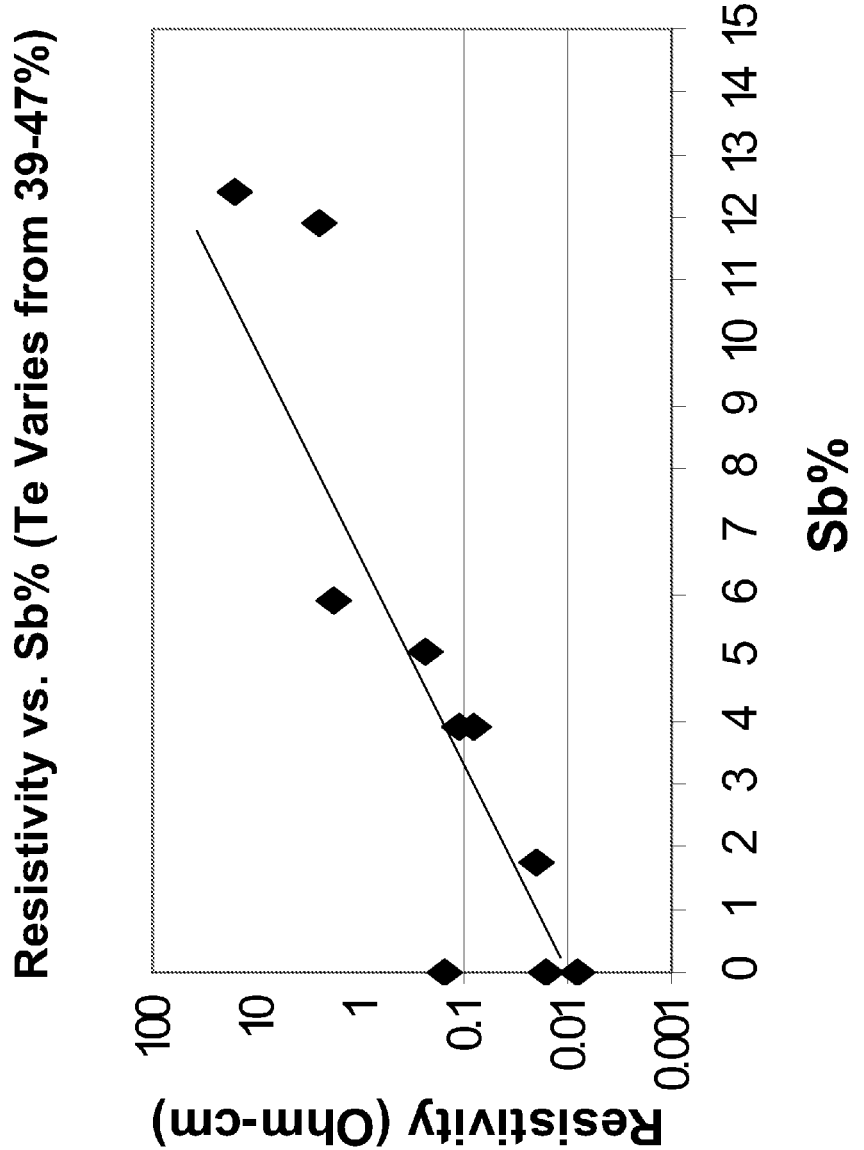
FIG. 4 is a graphical representation showing how resistivity varies relative to Sb in a GST film having high Te and high Ge after annealing at 350 degree C.

Referring now to FIG. 4, the resistivity in ohm-cm is shown versus the percentage of Sb for a GST sample after annealing at 350 degrees C. As can be seen, for values when the Sb is 4% or less, the resistivity is a corresponding value of 0.1 ohm-cm or less. Also, the resistivity increases quickly for a corresponding percentage-wise increase in Sb.

Figure 5:
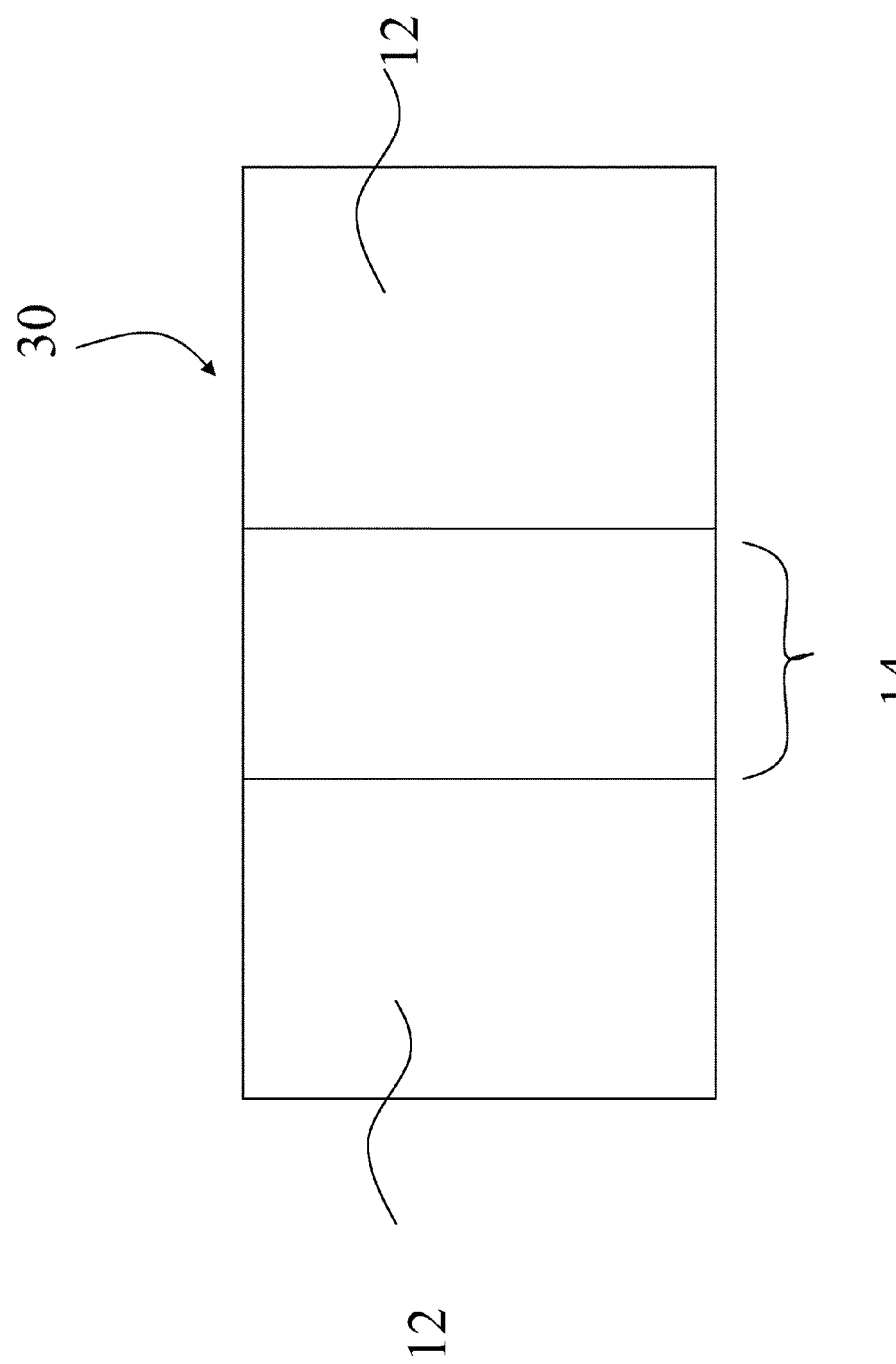
FIG. 5 is a schematic representation of a substrate having a topographical feature and in which a film is polished off the substrate.
Figure 6:
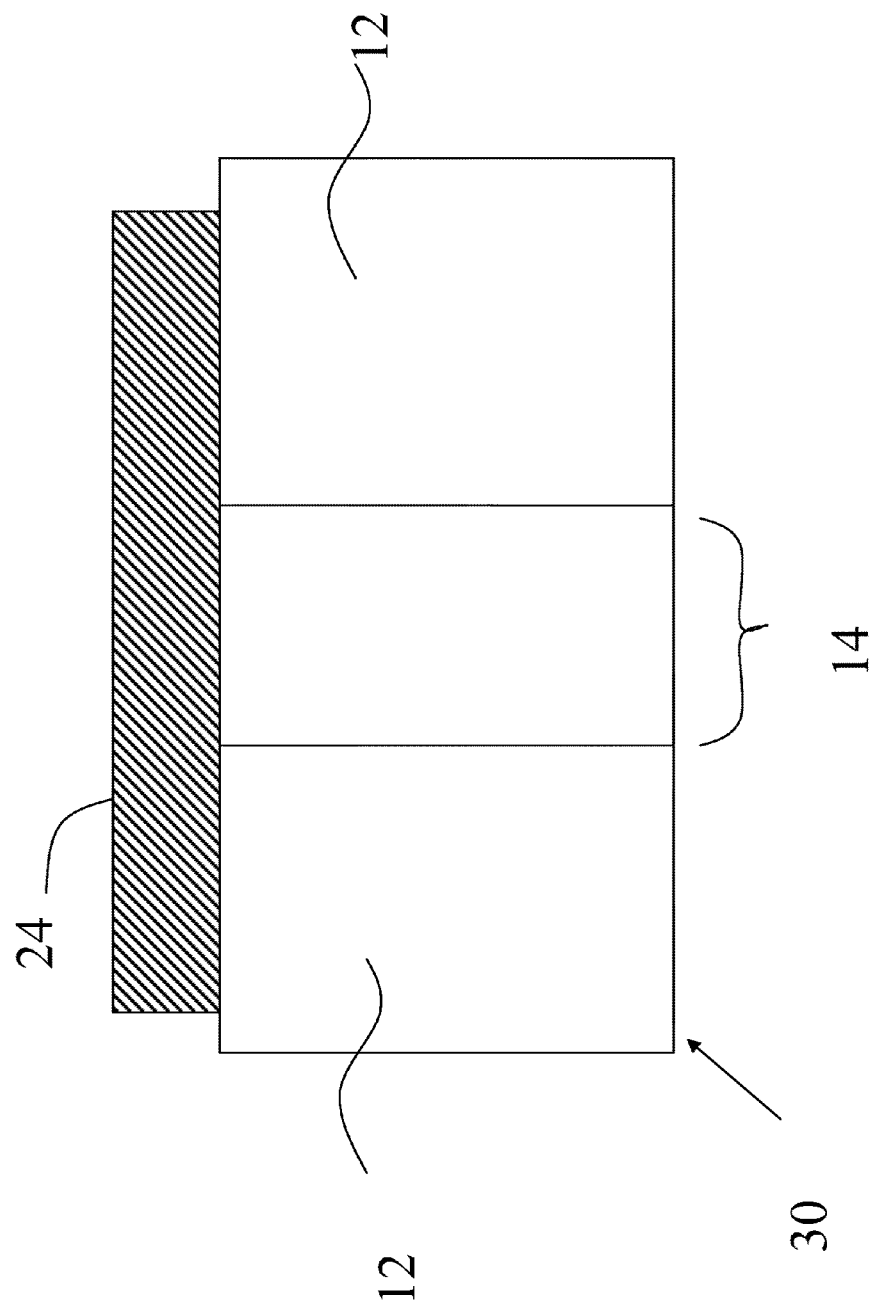
FIG. 6 is a schematic representation of a substrate having an electrode thereon.

In any embodiment, once the annealing process is completed, the substrate and annealed film are polished to remove excess film to produce a structure 30 having topographical features 14 in which the material of the film (e.g., GST or the like) is deposited, as is shown in FIG. 5. Metal contacts or electrodes 24 are then deposited onto the structure 30 so as to be in contact with the material located in the topographical feature 14, as is shown in FIG. 6. Such metal contacts include, but are not limited to electrodes fabricated of TiN, TiAlN, or the like.

Figures 7A, 7B:
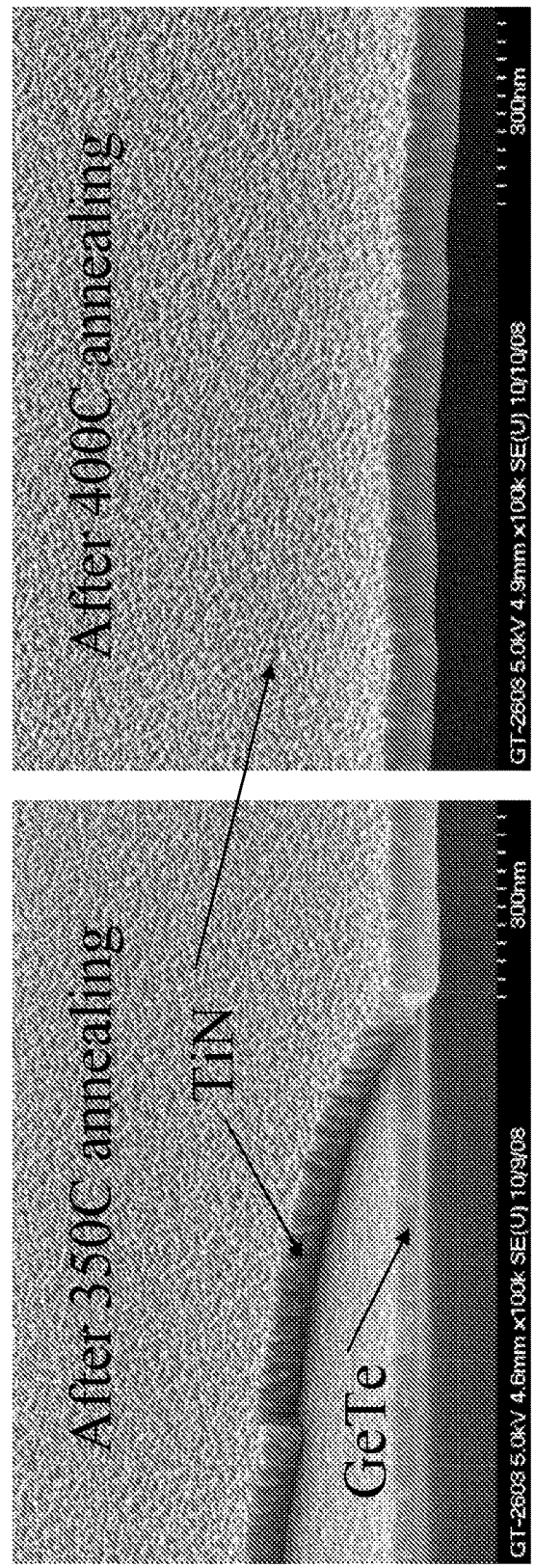
FIG. 7A is an image of high Te germanium telluride film with TiN over it after annealing at a first temperature.
FIG. 7B is an image of high Te germanium telluride film with TiN over it after annealing at a second temperature.

Referring now to FIGS. 7A and 7B, the adhesion of high Te germanium telluride films to TiN is shown. In FIG. 7A, the annealing was carried out at 350 degrees C., and in FIG. 7B, the annealing was carried out at 400 degrees C. The germanium telluride sample was 275.75 angstroms in thickness and was 56% Ge and 43.7% Te.

Referring now to FIGS. 8A-8D, the adhesion of GST film having high Ge and high Te content to TiN is shown. In FIG. 8A, the film is shown with TiN on top of the GST. In FIG. 8B, the same film can be seen at a different resolution. In FIGS. 8C and 8D, the textures of the TiN are shown at different resolutions. In the sample shown in FIG. 8C, the film was annealed at 375 degrees C., and in FIG. 8D, the film was annealed at 400 degrees C. In any embodiment, the GST provides for excellent adhesion with TiN.

Films made of the materials of the present invention as disclosed herein have desirably improved adhesion to a nitrogen-containing metal electrode film such as TiAlN or TiN because of the existing GeN precipitates. More particularly, the GeN clusters in the grain boundary of the $Ge_xTe_y$ or GST film would adhere better to TiN or TiAlN than Ge or Te alone since the nitrogen may share bonding to either or both Ge and Ti, thereby forming a bridge for adhesion.

The above-described embodiments allow conformal CVD or other deposition of $Ge_xTe_yN_z$ or $Ge_xTe_yN_zSb$ (or germanium telluride with another element) by increasing the crystallization temperature through the deposition of the film while reducing the crystallization temperature after annealing through the reduction of nitrogen. This facilitates the conformal amorphous deposition during growth (due to higher crystallization temperature) and also provides for desirably fast operation in a finished PCM device.

The foregoing solves various problems in the PCM field. First, it allows for the conformal deposition of $Ge_xTe_yN_z$ by increasing the crystallization temperature via the existing nitrogen and non-stoichiometric Te deficient $Ge_xTe_y$ to prevent crystallization during high temperature deposition. Second, through long annealing times at the growth temperature or elevated temperature, sufficiently high nitrogen contents may effectively consume large percentages of Ge to form GeN. Thus, the remaining Ge may balance with the deficient Te to form stoichiometric germanium telluride with the nitrogen expelled. Without such a method, the ability to achieve a stoichiometric amorphous germanium telluride ratio (approximately 1:1 in the amorphous phase as deposited) with low nitrogen may be compromised. Third, the final germanium telluride film after annealing is lower in phase transformation temperature than that of $Ge_xTe_yN$, which promotes faster device operation. Fourth, the existing GeN promotes better adhesion of $Ge_xTe_yN_z$ to nitrogen containing top or bottom electrodes, such as TiN and TiAlN. Fifth, the conformal deposition of $Ge_xTe_yN_z$ allows the addition of other elements to be incorporated such as Sb. As long as the other element is present in a small amount, the amorphous deposition characteristics of $Ge_xTe_yN_z$ (with higher phase change temperature) does not change a substantial amount. Sixth, in the same fashion as Sb is added, additional elements can be added.

Example 1

$Ge_xTe_y$ Film Composition

In one $Ge_xTe_yN_z$ film of the present invention, the as-deposited measured Ge:Te was 55:45, and nitrogen inside the $Ge_xTe_y$ lattice was 15-40%. The crystallization temperature was increased from 150-175 degrees C. (typical GST alloy crystallization temperature) to about 325-350 degrees C. Upon annealing at 325 degrees C. for 1 hour, resistivity as low as 0.02 ohms-cm was achieved. It was determined that additional annealing at 350 degrees C. for 1 hour can lead to further resistivity reduction to 0.002-0.004 ohms-cm. Furthermore, the $Ge_xTe_yN$ film as deposited was found to be amorphous and the deposition thereof was found to be sufficiently conformal and substantially void free and capable of filling a 40 nm hole structure with a high aspect ratio greater than 5 to 1. Also, a nitrogen-containing GST film was formed in which Sb was as high as 10% while exhibiting no impact on the deposition of conformal GST film. Moreover, the existence of many GeN clusters in the films formed was determined to alter the properties of the $Ge_xTe_yN_z$ films.

Example 2

Atomic Analyses of GST with High Nitrogen Content

Atomic analyses of GST with high nitrogen content were measured using X-Ray Fluorescence (XRF) and low energy X-ray emission spectroscopy (LEXES). Four trials for two different samples before and after annealing at various temperatures were performed. Results for both samples are tabulated below.

TABLE 1

GST with high nitrogen content (measured by XRF)

| Sample | Conditions | Thickness | Ge % | Sb % | Te % | N % |
|---|---|---|---|---|---|---|
| 1 | As-deposited | 649.9 | 37.9 | 2.8 | 36.5 | 22.82 |
| 1 | after 350 C. annealing 45 min in $N_2$ | 628.8 | 39.6 | 2.9 | 39.6 | 17.9 |
| 1 | after 375 C. annealing 30 min in $N_2$ | 566 | 52.4 | 3.2 | 39.6 | 14.8 |

Similar analysis was also performed for germanium telluride having a lower nitrogen content after an annealing process at 325 degrees C. Results for one sample are tabulated below. The nitrogen is apparently lower (about 15%) due to nitrogen reduction through annealing.

TABLE 2

Germanium telluride with lower nitrogen content after annealing

| Sample | Ge Dose (atoms/cm²) | Sb Dose (atoms/cm²) | Te Dose (atoms/cm²) | N Dose (atoms/cm²) | Ge (at. %) | Sb (at. %) | Te (at. %) | N (at. %) |
|---|---|---|---|---|---|---|---|---|
| 2 | 8.28E+16 | 1.79E+14 | 5.57E+16 | 2.50E+16 | 50.6 | 0.1 | 34.0 | 15.3 |

Example 3

Annealing Effect on the Resistivity of GST Film

Resistivity measurements were taken on an annealed GST film having a high nitrogen content. The measurements were taken using a four-point probe measurement to eliminate the effects of contact resistance. Annealing converted the GST from a high resistive amorphous state to a high conductive crystalline status. For a sample 590.7 angstroms (A) thick, the Ge was 54.1%, Sb was 0.4%, and Te was 45.5%. The XRF did not account for the nitrogen. Results are tabulated below.

TABLE 3

Resistivity measurements

| Film | Resistivity (ohm-cm) |
|---|---|
| As deposited | 59 |
| Annealed at 350 degrees C. for 0.5 hours | 0.03 |
| Annealed at 325 degrees C. for 1 hour and 350 degrees C. for 0.5 hours | 0.006 |

TABLE 4

Resistivity measurements of GeTe and GST at various Sb composition (<5%)

| Run # | Thickness (angstroms) | Ge % | Te % | Sb % | Resistivity (ohm-cm) after 350 C. 45 min annealing in $N_2$ |
|---|---|---|---|---|---|
| 2868 | 132.6 | 60 | 39.3 | 0 | 0.008 |
| 2870 | 370.7 | 57.3 | 42.01 | 0 | 0.15 |
| 2869 | 285 | 58.1 | 41.4 | 0 | 0.016 |
| 2872 | 304.4 | 54.2 | 44 | 1.76 | 0.02015 |
| 2873 | 309 | 51.9 | 44.3 | 3.9 | 0.08265 |
| 2871 | 322 | 53.7 | 42.3 | 3.9 | 0.1128 |

TABLE 5

Resistivity measurement of GeTe and GST at various Sb composition (>5%)

| Run # | Thickness (angstroms) | Ge % | Te % | Sb % | Resistivity (ohm-cm) after 350 C. 45 min annealing in $N_2$ |
|---|---|---|---|---|---|
| 2874 | 424 | 49.3 | 45.6 | 5.1 | 0.2319 |
| 2878 | 136 | 52.5 | 41.6 | 5.9 | 5.9 |
| 2879 | 124.7 | 46 | 42.2 | 11.9 | 11.9 |
| 2881 | 316 | 45.5 | 42.1 | 12.4 | 12.4 |

As can be seen from Table 4 for Sb<5%, with the desired Ge:Te ratio, the GST materials have post annealing resistivity all essentially less than 0.1 ohm-cm. Before annealing, these materials all exhibit resistivity too high to be measured by four-point probe measurements, which is 100 ohm-cm. In Table 5 for Sb>5%, even with a similar proportion of Ge:Te ratio, resistivity of greater than 0.1 ohm-cm is obtained, and this resistivity quickly becomes greater than 10 ohm-cm, which is generally too high for many applications. Referring back to FIG. 4, the effects of resistivity on increasing amounts of Sb are shown.

In FIGS. 9A and 9B, x-ray diffraction scans of GeTe film (370.7 angstroms, Ge 57.3%, Te 42.1%) before and after annealing at 350 degrees C. for 45 minutes are shown. The materials are clearly amorphous with high resistivity as shown in Table 6 before annealing and clearly converted into crystalline form after annealing with very low resistivity. The Ge and Te composition of the film changed a very small amount after annealing, indicating minimum loss of Ge or Te elements during annealing.

In FIGS. 10A and 10B, x-ray diffraction scans of GST film (309 angstroms Ge 51.9%, Te 44.3%, Sb 3.9%) before and after annealing at 350 degrees C. for 45 minutes are shown. The materials are clearly amorphous with high resistivity before annealing and clearly converted into crystalline form after annealing with low resistivity, as shown in Table 6. The Ge, Sb and Te composition of the film changed a very small amount after annealing, indicating minimum loss of Ge, Sb, or Te elements during annealing

TABLE 6

Composition changes after 350 degrees C. annealing

| Run # | Thickness (angstroms) | Ge % | Te % | Sb % | Resistivity (ohm-cm) after 350 C. 45 min annealing in N2 |
|---|---|---|---|---|---|
| 2870 before annealing | 370.7 | 57.3 | 42.01 | 0 | >74 |
| 2870 after annealing | 358 | 57.9 | 41.8 | 0 | 0.015 |
| 2873 before annealing | 309 | 51.9 | 44.3 | 3.9 | >61 |
| 2873 after annealing | 304.4 | 51.8 | 44.4 | 3.84 | 0.02015 |

Although this invention has been shown and described with respect to the detailed embodiments thereof, it will be understood by those of skill in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention not be limited to the particular embodiments disclosed in the above detailed description, but that the invention will include all embodiments falling within the scope of the following claims.

What is claimed is:

1. A phase change memory device, comprising:
a phase change memory material comprising GST and nitrogen, wherein the phase change memory material includes from about 40 to about 60 atomic percent germanium, up to about 15 atomic percent antimony, from about 30 atomic percent to about 49 atomic percent tellurium, and from about 5 to about 15 atomic percent nitrogen, wherein the phase change memory material is conformally deposited on a topographical feature of the substrate.

2. The phase change memory device of claim 1, wherein the phase change memory material includes about 40 atomic percent germanium, and about 49 atomic percent tellurium.

3. The phase change memory device of claim 1, wherein the phase change memory material has resistivity of less than 0.1 ohm-centimeters in the crystalline phase, and resistivity greater than about 10 ohm-centimeters in the amorphous state.

4. The phase change memory device of claim 1, wherein the topographical feature of the substrate comprises a feature selected from the group consisting of holes, vias, and trenches.

5. The phase change memory device of claim 1, wherein the phase change memory material is void free.

6. The phase change memory device of claim 1, having device dimensions below 20 nm.

7. The phase change memory device of claim 1, having device dimensions below 10 nm.

8. The phase change memory device of claim 1, wherein the phase change memory material has a composition of 50.9% germanium, 9.7% antimony and 39.4% tellurium.

9. The phase change memory device of claim 1, wherein the phase change memory material has a composition of 49% germanium, 9% antimony and 41% tellurium.

10. The phase change memory device of claim 1, characterized by an endurance of greater than about $10^7$ write cycles.

11. A method of forming a phase change memory device, comprising vapor depositing a phase change memory material comprising GST and nitrogen on a substrate in amorphous form, wherein the phase change memory material includes from about 40 to about 60 atomic percent germanium, up to about 15 atomic percent antimony, from about 30 atomic percent to about 49 atomic percent tellurium, and from about 5 to about 15 atomic percent nitrogen.

12. The method of claim 11, wherein germanium in said phase change memory material is deposited using a germanium precursor comprising germanium bis(n-butyl,N,N-diisopropylamidinate).

13. The method of claim 11, wherein tellurium in said phase change memory material is deposited using a tellurium precursor comprising di-tert-butyl telluride.

14. The method of claim 11, wherein antimony in said phase change memory material is deposited using an antimony precursor comprising tris(dimethylamido)antimony.

15. The method of claim 11, wherein the phase change memory material is deposited using a germanium precursor comprising germanium bis(n-butyl,N,N-diisopropylamidinate), an antimony precursor comprising tris(dimethylamido) antimony, and a tellurium precursor comprising di-tert-butyl telluride.

16. A process for fabricating a phase change device, said process comprising the steps of: depositing a phase change material on a substrate via a chemical vapor deposition (CVD) process, said phase change material comprising $Ge_xTe_yN_z$ in the form of a film, where x is about 40% to about 60%, y is about 30% to about 49%, and z is about 5% to about 40%, wherein said phase change material is substantially conformally deposited with regard to a topographical feature of said substrate to form a void free phase change material structure; annealing said deposited film, wherein said annealing reduces an amount of nitrogen in said film and transforms said $Ge_xTe_yN_z$ to an alloy of $Ge_xTe_yN_z$— and GeN; and providing a chemical mechanical polish to said deposited film after annealing said film.

17. The process of claim 16, wherein said $Ge_xTe_yN_z$ further comprises $A_m$, wherein A is at least one of Sb, Sn, In, Ga, or Zn and m is up to about 15%.

18. The process of claim 16, wherein said $Ge_xTe_yN_z$ further comprises antimony in an amount of up to 15%.

19. The process of claim 17, wherein the phase change material includes about 40 atomic percent germanium, and about 49 atomic percent tellurium.

20. The phase change memory device of claim 1, wherein the phase change memory material is conformally deposited in amorphous form.

* * * * *